US012660509B2

(12) United States Patent
Yoshikawa

(10) Patent No.: US 12,660,509 B2
(45) Date of Patent: Jun. 16, 2026

(54) MAGNETIC MEMORY DEVICE

(71) Applicant: KIOXIA CORPORATION, Tokyo (JP)

(72) Inventor: Masatoshi Yoshikawa, Tokyo (JP)

(73) Assignee: Kioxia Corporation, Tokyo (JP)

( * ) Notice: Subject to any disclaimer, the term of this patent is extended or adjusted under 35 U.S.C. 154(b) by 776 days.

(21) Appl. No.: 17/684,104

(22) Filed: Mar. 1, 2022

(65) Prior Publication Data

US 2023/0082665 A1 Mar. 16, 2023

(30) Foreign Application Priority Data

Sep. 14, 2021 (JP) ................................. 2021-149336

(51) Int. Cl.
H10N 50/80 (2023.01)
G11C 11/16 (2006.01)
(Continued)

(52) U.S. Cl.
CPC ........... H10N 50/80 (2023.02); G11C 11/161 (2013.01); G11C 11/1659 (2013.01);
(Continued)

(58) Field of Classification Search
CPC .............. G11C 11/161; G11C 11/1653; G11C 11/1659; G11C 11/1675; H10B 61/10;
(Continued)

(56) References Cited

U.S. PATENT DOCUMENTS 8,350,347 B2 1/2013 Gaudin et al.
10,262,711 B2 4/2019 Ishikawa et al.
(Continued)

FOREIGN PATENT DOCUMENTS

JP 6063381 B2 1/2017
JP 6178451 B1 8/2017
(Continued)

OTHER PUBLICATIONS

Yu-Ching Liao et al., "Spin-Orbit-Torque Material Exploration for Maximum Array-Level Read/Write Performance", IEEE International Electron Devices Meeting (IEDM), 2020, DOI: 10.1109/IEDM13553.2020.9371979, 4 pages.
(Continued)

*Primary Examiner* — Fazli Erdem
(74) *Attorney, Agent, or Firm* — Kim & Stewart LLP

(57) ABSTRACT

A magnetic memory device includes a three-terminal type memory cell. A first terminal is connected to a first conductor layer. A second terminal is connected to a second conductor layer. A third terminal is connected to a third conductor layer. The memory cell includes a fourth conductor connected to the first conductor layer, the second conductor layer, and the third conductor layer. A magnetoresistance effect element of the memory cell is coupled between the third conductor layer and the fourth conductor layer. A first switching element is coupled to the second conductor layer and the fourth conductor layer. A second switching element coupled to the first conductor layer and the third conductor layer. The fourth conductor layer includes a first ferromagnetic layer and a first non-magnetic layer. The first non-magnetic layer comprises at least one of ruthenium, iridium, rhodium, or osmium.

16 Claims, 14 Drawing Sheets

(51) Int. Cl.

| | | |
|---|---|---|
| *H10B 61/00* | (2023.01) | |
| *H10N 50/01* | (2023.01) | |
| *H10N 50/85* | (2023.01) | |

(52) U.S. Cl.
CPC ............. *H10B 61/10* (2023.02); *H10B 61/22* (2023.02); *H10N 50/85* (2023.02); *G11C 11/1675* (2013.01); *H10N 50/01* (2023.02)

(58) Field of Classification Search
CPC ........ H10B 61/22; H10N 50/01; H10N 50/10; H10N 50/80; H10N 50/85
USPC ........................................................ 257/421
See application file for complete search history.

(56) References Cited

U.S. PATENT DOCUMENTS

| | | | | |
|---|---|---|---|---|
| 10,861,523 | B2 | 12/2020 | Sasaki | |
| 2011/0059557 | A1* | 3/2011 | Yamagishi | H10N 70/826 |
| | | | | 257/E21.003 |
| 2013/0064009 | A1 | 3/2013 | Kitano | |
| 2013/0182501 | A1 | 7/2013 | Sakimura | |
| 2017/0270985 | A1 | 9/2017 | Shimomura et al. | |
| 2019/0326353 | A1* | 10/2019 | O'Brien | H10N 70/826 |
| 2020/0286536 | A1* | 9/2020 | Fukami | H01F 10/329 |
| 2020/0303625 | A1* | 9/2020 | Yoshikawa | H10N 50/85 |
| 2020/0303632 | A1 | 9/2020 | Watanabe | |
| 2021/0074910 | A1 | 3/2021 | Saito et al. | |
| 2021/0098689 | A1 | 4/2021 | Watanabe | |
| 2021/0167278 | A1* | 6/2021 | Ishitani | G11C 11/161 |
| 2023/0069841 | A1* | 3/2023 | Asao | H10N 50/10 |

FOREIGN PATENT DOCUMENTS

| | | |
|---|---|---|
| JP | 6290487 B1 | 3/2018 |
| JP | 2020035971 A | 3/2020 |
| WO | 2019159962 A1 | 8/2019 |

OTHER PUBLICATIONS

J.E. Hirsch, "Spin Hall Effect", The American Physical Society, Physical Review Letters, vol. 83, No. 9, Aug. 30, 1999, pp. 1834-1837.

Luqiao Liu et al., "Spin torque switching with the giant spin Hall effect tantalum", Cornell University and Kavli Institute at Cornell, Ithaca, New York, 31 pages.

Ioan Mihai et al., "Perpendicular switching of a single ferromagnetic layer induced by in-plane current injection", Nature, vol. 476, Aug. 11, 2011, pp. 189-193.

Kevin Garello et al., "Ultrafast magnetization switching by spin-orbit torques", Applied Physics Letters, vol. 105, 212402, 2014, 5 pages.

S. Fukami et al., "A spin-orbit torque switching scheme with collinear magnetic easy axis and current configuration", Nature Nanotechnology, vol. 11, Jul. 2016, pp. 621-625.

J.Q. Li et al., "Edelstein effect in pseudospin Dirac systems", Physical Review B 103, 085401, 2021, DOI: 10.1103/PhysRevB.103.085401, 7 pages.

Luqiao Liu et al., "Current-Induced Switching of Perpendicularly Magnetized Magnetic Layers Using Spin Torque from the Spin Hall Effect", Physical Review Letters 109, 096602, Aug. 31, 2012, DOI: 10.1103/PhysRevLett.109.096602, 5 pages.

* cited by examiner

MAGNETIC MEMORY DEVICE

CROSS-REFERENCE TO RELATED APPLICATION

This application is based upon and claims the benefit of priority from Japanese Patent Application No. 2021-149336, filed Sep. 14, 2021, the entire contents of which are incorporated herein by reference.

FIELD

Embodiments described herein relate generally to a magnetic memory device.

BACKGROUND

Magnetic memory devices using a magnetoresistance effect element as a storage element are known. Various methods have been proposed as a method for writing data into magnetoresistance effect elements.

DETAILED DESCRIPTION

In general, according to one embodiment, a magnetic memory device includes a memory cell of a three-terminal type. The memory cell has a first terminal connected to a first conductor layer, a second terminal connected to a second conductor layer, and a third terminal connected to a third conductor layer. The memory cell includes a fourth conductor layer having a first portion connected to the first conductor layer, a second portion connected to the second conductor layer, and a third portion connected to the third conductor layer. The third portion is between the first portion and the second portion. A magnetoresistance effect element of the memory cell is coupled between the third conductor layer and the fourth conductor layer. A first switching element is coupled between the second conductor layer and the fourth conductor layer. A second switching element is coupled between the first conductor layer and the third conductor layer. The fourth conductor layer includes a first ferromagnetic layer, and a first non-magnetic layer. The first non-magnetic layer is between the first ferromagnetic layer and the magnetoresistance effect element. The first non-magnetic layer comprises a first element selected from ruthenium, iridium, rhodium, and osmium.

Hereinafter, certain example embodiments will be described with reference to drawings. In the following description, components, elements, aspects, etc. having a substantially similar function and configuration are designated by the same reference symbols. When distinguishing between components, elements, aspects, etc. of the same type/function, a superscript, suffixes, appended indexing numbers/letters, and/or the like may be added to an otherwise shared reference symbol to distinguish between such components, elements, aspects, etc. When it is not necessary to distinguish between components, elements, aspects, etc. of the same type/function, the shared reference symbol may be used to refer to each instance of the components, elements, aspects, etc., and no suffix is added to the shared reference symbol.

In the present specification, a magnetic memory device is, for example, a magnetoresistive random access memory (MRAM). Each cell of an MRAM includes a magnetic tunnel junction (MTJ) element providing a tunneling magnetoresistance effect. Each MTJ element is composed of a reference layer and a storage layer with a tunnel barrier layer between these layers. The magnetoresistance effect causes a resistance change according to the changes in magnetization direction between the storage layer and the reference layer.

1. First Embodiment

1.1 Configuration

First, the configuration of a magnetic memory device according to a first embodiment will be described.

1.1.1 Magnetic Memory Device

Figure 1:
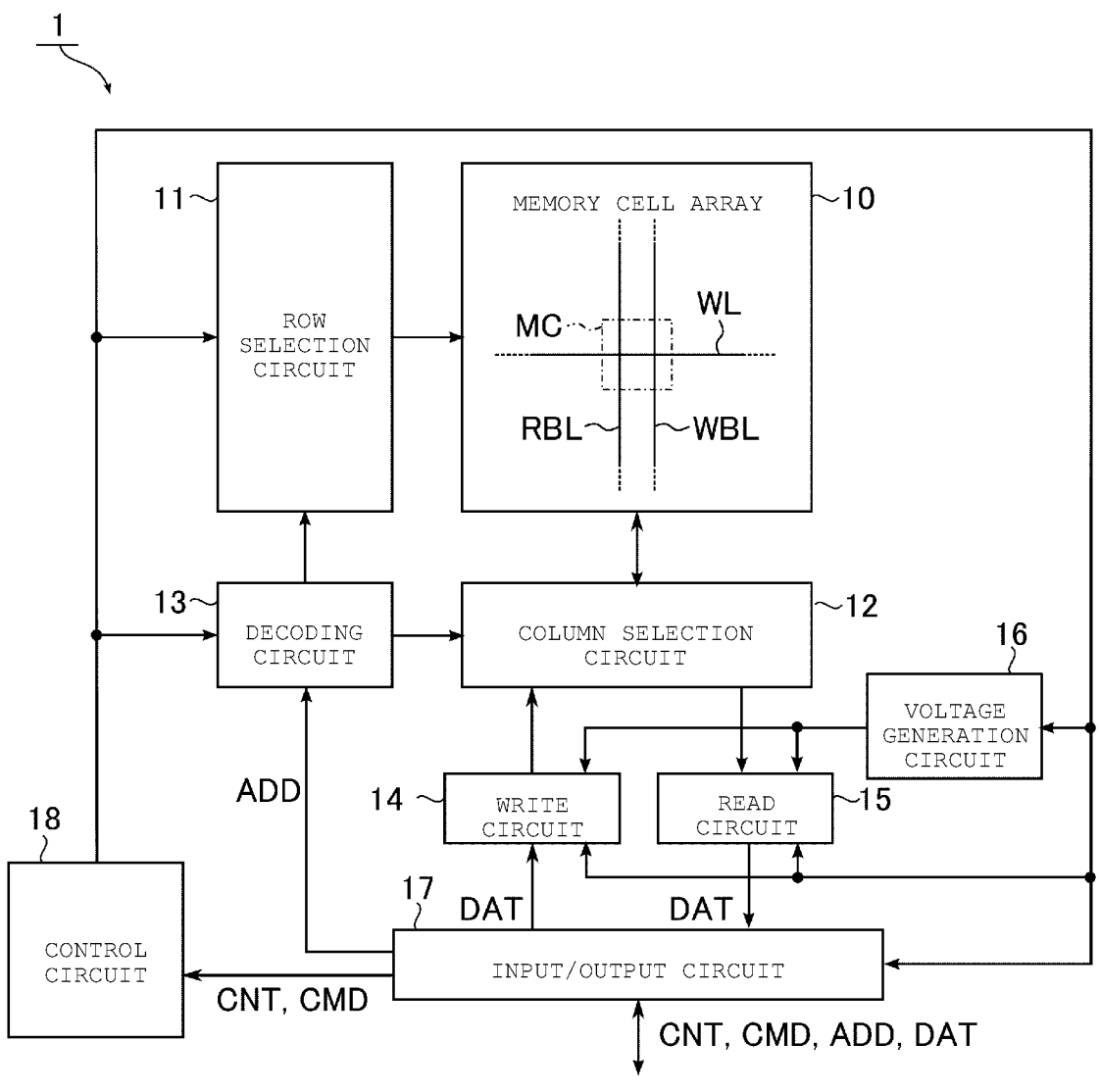
FIG. 1 is a block view of a magnetic memory device according to an embodiment.

FIG. 1 is a block view illustrating an example of a configuration of a magnetic memory device according to the first embodiment.

A magnetic memory device 1 includes a memory cell array 10, a row selection circuit 11, a column selection circuit 12, a decoding circuit 13, a write circuit 14, a read circuit 15, a voltage generation circuit 16, an input/output (I/O) circuit 17, and a control circuit 18.

The memory cell array 10 is a data storage unit in the magnetic memory device 1. The memory cell array 10 includes a plurality of memory cells MC. Each of the memory cells MC is particularly associated with one row and one column. The memory cells MC in the same row are coupled to the same word line WL, and the memory cells MC in the same column are coupled to the same set of read bit line RBL and write bit line WBL.

The row selection circuit 11 selects the different rows of the memory cell array 10. The row selection circuit 11 is coupled to the memory cell array 10 via word lines WL. The row selection circuit 11 is supplied with the decoding result (row address) of an address ADD from the decoding circuit 13. The row selection circuit 11 selects the word line WL corresponding to the address ADD. In the following, a word line WL corresponding to the address ADD is referred to as a selected word line WL. The word lines WL other than the selected word line(s) WL are referred to as a non-selected word line WL.

The column selection circuit 12 selects the columns of the memory cell array 10. The column selection circuit 12 is coupled to the memory cell array 10 via read bit lines RBL and write bit lines WBL. The column selection circuit 12 is supplied with the decoding result (column address) of the address ADD from the decoding circuit 13. The column selection circuit 12 selects the read bit line RBL and the write bit line WBL corresponding to the address ADD. In the following, a read bit line RBL and a write bit line WBL corresponding to the address ADD will be referred to as a selected bit line RBL and a selected bit line WBL. The read bit lines RBL other than the selected bit line(s) RBL are referred to as non-selected bit lines RBL. The write bit lines WBL other than the selected bit line(s) WBL are referred to as non-selected bit lines WBL.

The decoding circuit 13 is a decoder that decodes the address ADD from the input/output circuit 17. The decoding circuit 13 decodes the address ADD and supplies the decoding result to the row selection circuit 11 and the column selection circuit 12. The address ADD includes a selected column address and a selected row address.

The write circuit 14 comprises, for example, a write driver. The write circuit 14 writes data into the memory cell MC.

The read circuit 15 comprises, for example, a sense amplifier. The read circuit 15 reads data from the memory cell MC.

The voltage generation circuit 16 uses a power supply voltage provided from the outside of the magnetic memory device 1 to generate voltages for various operations of the memory cell array 10. For example, the voltage generation circuit 16 generates various voltages required for a write operation and outputs the voltages to the write circuit 14. The voltage generation circuit 16 also generates various voltages required for a read operation and outputs the voltages to the read circuit 15.

The input/output circuit 17 handles communication with the outside of the magnetic memory device 1. The input/output circuit 17 transfers the address ADD received from the outside of the magnetic memory device 1 to the decoding circuit 13. The input/output circuit 17 also transfers a command CMD received from the outside of the magnetic memory device 1 to the control circuit 18. The input/output circuit 17 sends and receives various control signals CNT between the control circuit 18 and the outside of the magnetic memory device 1. The input/output circuit 17 transfers data DAT received from the outside of the magnetic memory device 1 to the write circuit 14 and outputs the data DAT from the read circuit 15 to the outside of the magnetic memory device 1.

The control circuit 18 comprises, for example, a processor, such as a central processing unit (CPU), and a read only memory (ROM). The control circuit 18 controls the operations of the row selection circuit 11, the column selection circuit 12, the decoding circuit 13, the write circuit 14, the read circuit 15, the voltage generation circuit 16, and the input/output circuit 17 based on the control signals CNT and commands CMD.

1.1.2 Memory Cell Array

Circuit Configuration

Figure 2:
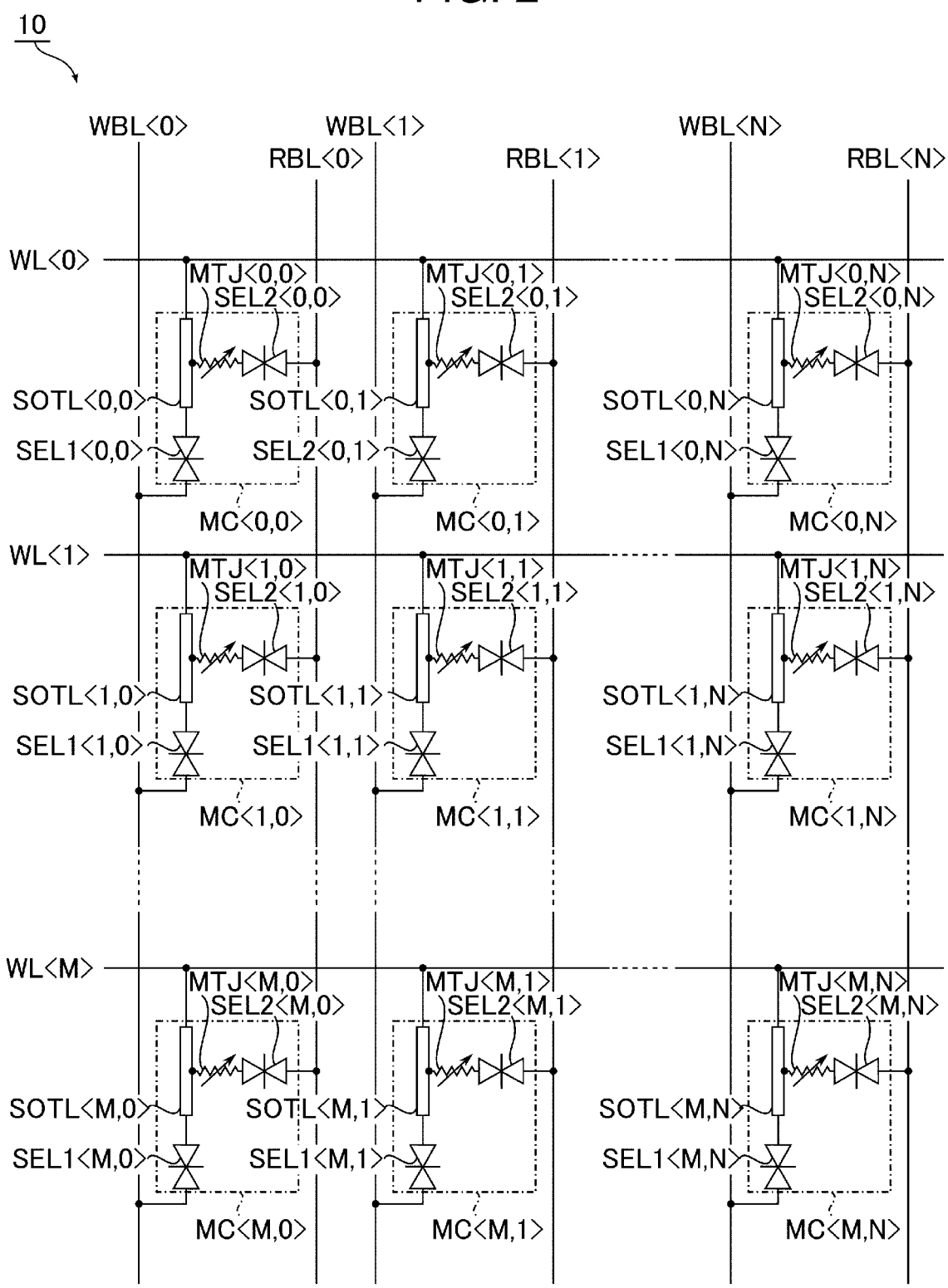
FIG. 2 is a circuit view of a memory cell array according to an embodiment.

FIG. 2 is a circuit view illustrating an example of a circuit configuration of the memory cell array according to the embodiment. In FIG. 2, each of the word lines WL, the read bit lines RBL, and the write bit lines WBL is illustrated with an identifying suffix ("<X>").

The memory cell array 10 includes a plurality of memory cells MC, a plurality of word lines WL, a plurality of read bit lines RBL, and a plurality of write bit lines WBL. In the example of FIG. 2, the plurality of memory cells MC includes $(M+1) \times (N+1)$ individual memory cells MC<0,0>, MC<0,1>, . . . MC<0,N>, MC<1,0>, . . . MC<M,N> (where M and N are integers of 2 or more). In the example of FIG. 2, the case where M and N are integers of 2 or more is illustrated, but the present disclosure is not limited thereto and M and N may be 0 or 1. The plurality of word lines WL includes $(M+1)$ individual word lines WL<0>, WL<1>, . . . WL<M>. The plurality of read bit lines RBL includes $(N+1)$ individual read bit lines RBL<0>, RBL<1>, . . . RBL<N>. The plurality of write bit lines WBL includes $(N+1)$ individual write bit lines WBL<0>, WBL<1>, . . . WBL<N>.

The plurality of memory cells MC are arranged in a matrix in the memory cell array 10. Each memory cell MC is associated with one of the plurality of word lines WL and a pair of one read bit line RBL and one write bit line WBL. That is, the memory cell MC<i,j>(where $0 \leq i \leq M$, $0 \leq j \leq N$) is coupled to a word line WL<i>, a read bit line RBL<j>, and a write bit line WBL<j>.

The memory cell MC<i,j> is a three-terminal type memory cell including a first end coupled to the word line WL<i>, a second end coupled to the write bit line WBL<j>, and a third end coupled to the read bit line RBL<j>. The memory cell MC<i,j>includes switching elements SEL1<i,j>and SEL2<i,j>, a magnetoresistance effect element MTJ<i,j>, and a wiring SOTL<i,j>.

The wiring SOTL<i,j>includes a first portion, a second portion, and a third portion between the first portion and the second portion. The first portion of the wiring SOTL<i,j>is coupled to the word line WL<i>. The second portion of the wiring SOTL<i,j> is coupled to the write bit line WBL<j>. The third portion of the wiring SOTL<i,j> is coupled to the read bit line RBL<j>. The switching element SEL1<i,j> is coupled between the second portion of the wiring SOTL<i,j> and the write bit line WBL<j>. The magnetoresistance effect element MTJ<i,j> is coupled between the third portion of the wiring SOTL<i,j> and the read bit line RBL<j>. The switching element SEL2<i,j> is coupled between the magnetoresistance effect element MTJ<i,j> and the read bit line RBL<j>.

The switching elements SEL1 and SEL2 are two-terminal type switching elements. A two-terminal type switching element is different from a three-terminal type switching element such as a transistor. When the voltage applied between the two terminals of the two-terminal type switching element is less than a threshold voltage (threshold voltage Vth1 for switching element SEL1 and threshold voltage Vth2 for switching element SEL2, respectively), the two-terminal type switching element is in a "high resistance" state or an "off" state. That is, the switching elements SEL1 and SEL2 are in an electrically non-conductive state, or substantially so, when the applied voltage across the two terminals of the respective switching elements is less than the threshold voltage Vth1 and Vth2, respectively. When the voltage applied across the two terminals of the two-terminal type switching is equal to or higher than the threshold voltage (threshold voltage Vth1 for switching element SEL1 and threshold voltage Vth2 for switching element SEL2, respectively), the switching element changes (switches) to a "low resistance" state or an "on" state. That is, the switching elements SEL1 and SEL2 are in an electrically conductive state, or substantially so, when the voltage across the two terminals of the respective switching elements is greater than the threshold voltage Vth1 and Vth2. Thus, when the voltage applied to the corresponding memory cell MC is lower than the threshold voltages Vth1 and Vth2, the switching elements SEL1 and SEL2 enter an OFF state and function as insulators having a large resistance value. When the voltage applied to the corresponding memory cell MC exceeds the threshold voltages Vth1 and Vth2, the switching elements SEL1 and SEL2 enter an ON state and function as conductors having a small resistance value. The switching elements SEL1 and SEL2 switch conductivity based on the magnitude of the voltage applied regardless of the polarity of the voltage (regardless of the direction of the flowing current).

The wiring SOTL is a current path in the memory cell MC. For example, when the switching element SEL1 is in an on state and the switching element SEL2 is in an off state, the wiring SOTL functions as a current path between the word line WL and the write bit line WBL. When the switching element SEL1 is in an off state and the switching element SEL2 is in an on state, a part of the wiring SOTL functions as a current path between the word line WL and the read bit line RBL.

The magnetoresistance effect element MTJ is a resistance changing element. The magnetoresistance effect element MTJ can switch between a low resistance state and a high resistance state based on the current controlled by the switching elements SEL1 and SEL2. The magnetoresistance effect element MTJ functions as a storage element that stores data in a non-volatile manner by changing resistance state.

Planar Layout

Next, the planar layout of a memory cell array according to the embodiment will be described. In the following, a plane parallel to the surface of a substrate will be referred to as an XY plane.

Figure 3:
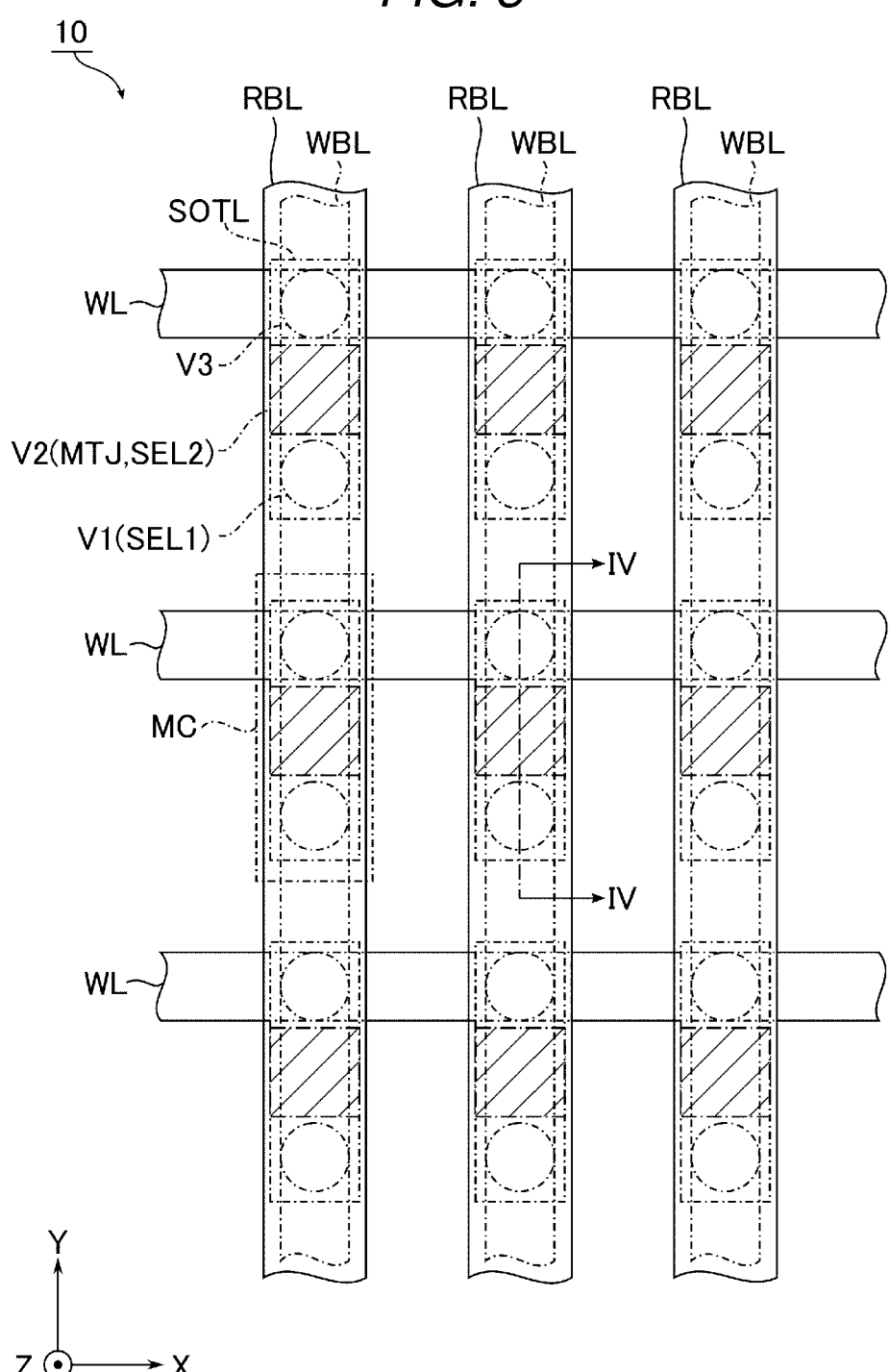
FIG. 3 is a plan view of a memory cell array according to an embodiment.

FIG. 3 is a plan view illustrating an example of the planar layout of the memory cell array according to the embodiment. In FIG. 3, the structure such as an insulator layer is omitted.

The memory cell array 10 further includes a plurality of vertical structures V1, a plurality of vertical structures V2, and a plurality of vertical structures V3. Each of the plurality of vertical structures V1 includes the switching element SEL1. Each of the plurality of vertical structures V2 includes the magnetoresistance effect element MTJ and the switching element SEL2.

The plurality of write bit lines WBL are arranged in the X direction. Each of the plurality of write bit lines WBL extends in the Y direction.

A plurality of word lines WL are provided above the plurality of write bit lines WBL. The plurality of word lines WL are arranged in the Y direction. Each of the plurality of word lines WL extends in the X direction.

A plurality of wirings SOTL are provided above the plurality of word lines WL. In a plan view, each of the plurality of wirings SOTL has a rectangular shape that is long in the Y direction with respect to the X direction. Each of the plurality of wirings SOTL extends in the Y direction. In a plan view, each of the plurality of wirings SOTL is provided in a matrix corresponding to a position overlapping with one word line WL and one write bit line WBL.

A plurality of read bit lines RBL are provided above the plurality of wirings SOTL. The plurality of read bit lines RBL are arranged in the X direction. Each of the plurality of read bit lines RBL extends in the Y direction. In a plan view, each of the plurality of read bit lines RBL is provided at a position overlapping with the plurality of write bit lines WBL.

The plurality of vertical structures V1 extend in the Z direction. In a plan view, the plurality of vertical structures V1 have a circular shape. Each of the plurality of vertical structures V1 couples between one corresponding write bit line WBL and one corresponding wiring SOTL. That is, each of the plurality of vertical structures V1 is coupled to the second portion of the corresponding wiring SOTL.

The plurality of vertical structures V2 extend in the Z direction. In a plan view, the plurality of vertical structures V2 have a rectangular shape. In a plan view, the plurality of vertical structures V2 may have a square shape. More specifically, in a plan view, each of the plurality of vertical structures V2 includes a side that has a length equal to the short side of the corresponding wiring SOTL and is parallel to the short side of the wiring SOTL, and a side that has a length shorter than the long side of the wiring SOTL and overlaps with the long side of the wiring SOTL. That is, the side surface parallel to the YZ plane of each of the plurality of vertical structures V2 is provided in the same plane (flush) as the side surface parallel to the YZ plane of the corresponding wiring SOTL. Each of the plurality of vertical structures V2 couples between one corresponding read bit line RBL and one corresponding wiring SOTL. That is, each of the plurality of vertical structures V2 is coupled to the third portion of the corresponding wiring SOTL.

The plurality of vertical structures V3 extend in the Z direction. In a plan view, the plurality of vertical structures V3 have a circular shape. Each of the plurality of vertical structures V3 couples between one corresponding word line WL and one corresponding wiring SOTL. That is, each of the plurality of vertical structures V3 is coupled to the first portion of the corresponding wiring SOTL.

Among the above configurations, a set of one wiring SOTL, one vertical structure V1 coupled to the one wiring SOTL, one vertical structure V2, and one vertical structure V3 functions as one memory cell MC.

Cross-Sectional Structure

Figure 4:
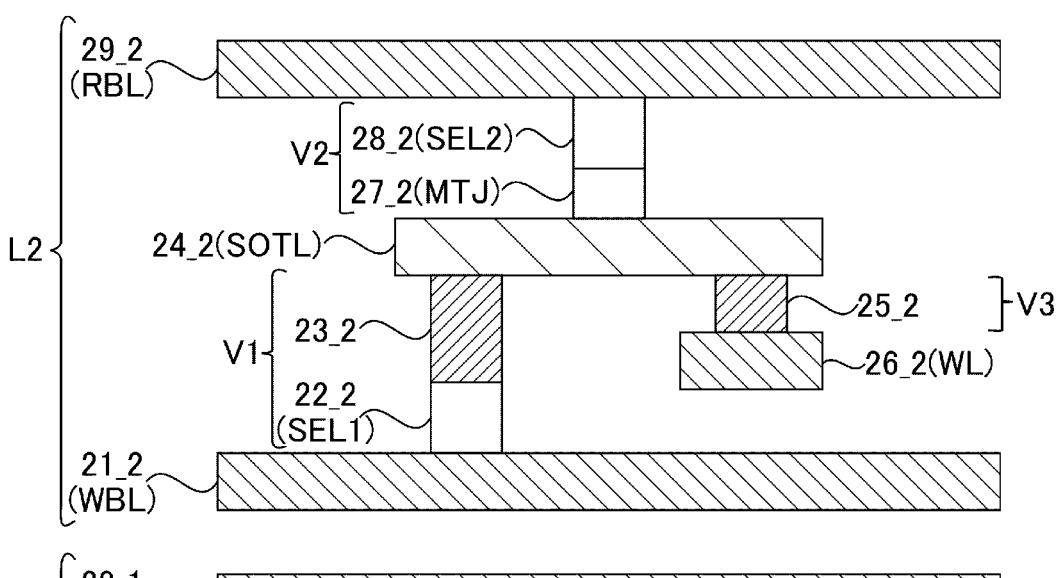
FIG. 4 is a cross-sectional view of a memory cell array according to an embodiment.
Figure 4:
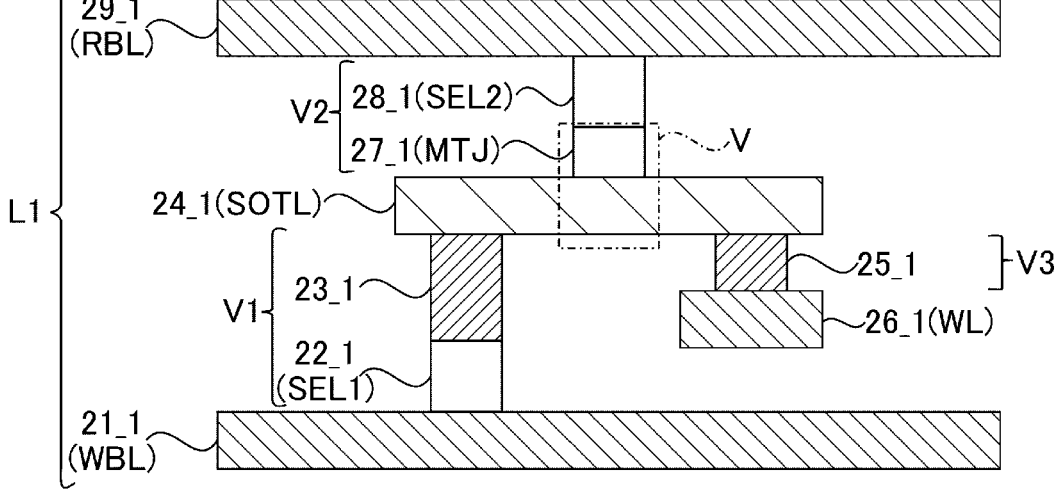
Figure 4:
Figure 4:
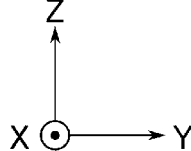

FIG. 4 is a cross-sectional view taken along the line IV-IV of FIG. 3, illustrating an example of the cross-sectional structure of a memory cell array according to the embodiment. The memory cell array 10 includes a semiconductor substrate 20 and structures L1 and L2. The structure L1 includes conductor layers 21_1, 23_1, 24_1, 25_1, 26_1, and 29_1, as well as element layers 22_1, 27_1, and 28_1. The structure L2 includes conductor layers 21_2, 23_2, 24_2, 25_2, 26_2, and 29_2, as well as element layers 22_2, 27_2, and 28_2.

The structures L1 and L2 are stacked in the Z direction above the semiconductor substrate 20. The structures L1 and L2 each correspond to the planar layout illustrated in FIG. 3.

Peripheral circuits, such as a row selection circuit 11 and a column selection circuit 12, may be provided between the semiconductor substrate 20 and the structure L1. In some examples, a circuit may not be formed between the semiconductor substrate 20 and the structure L1. When a circuit is not formed between the semiconductor substrate 20 and the structure L1, a shallow trench isolation (STI) feature may be formed in a portion of the semiconductor substrate 20 located below the structure L1.

The structure L1 will be described.

A conductor layer 21_1 is provided above the semiconductor substrate 20. The conductor layer 21_1 is used as a write bit line WBL. The conductor layer 21_1 extends in the Y direction.

The element layer 22_1 is provided on the upper surface of the conductor layer 21_1. The element layer 22_1 is used as a switching element SEL1.

The conductor layer 23_1 is provided on the upper surface of the element layer 22_1. The conductor layer 23_1 is used as a contact. The element layer 22_1 and the conductor layer 23_1 constitute the vertical structure V1.

The conductor layer 24_1 is provided on the upper surface of the conductor layer 23_1. The conductor layer 24_1 is used as a wiring SOTL. The portion of the conductor layer 24_1 in contact with the conductor layer 23_1 corresponds to the second portion of the wiring SOTL. The conductor layer 24_1 extends in the Y direction.

The conductor layer 25_1 is provided on the lower surface of the portion of the conductor layer 24_1 that is different from the portion where the conductor layer 23_1 is provided. The portion of the conductor layer 24_1 in contact with the conductor layer 25_1 corresponds to the first portion of the wiring SOTL. The conductor layer 25_1 is used as a contact. The conductor layer 25_1 constitutes the vertical structure V3.

The conductor layer 26_1 is provided on the lower surface of the conductor layer 25_1. The conductor layer 26_1 is used as a word line WL. The conductor layer 26_1 extends in the X direction.

The element layer 27_1 is provided on the upper surface of the portion of the conductor layer 24_1 between the portion where the conductor layer 23_1 is provided and the portion where the conductor layer 25_1 is provided. The portion of the conductor layer 24_1 in contact with the element layer 27_1 corresponds to the third portion of the wiring SOTL. The element layer 27_1 is used as a magnetoresistance effect element MTJ.

The element layer 28_1 is provided on the upper surface of the element layer 27_1. The element layer 28_1 is used as a switching element SEL2. The element layers 27_1 and 28_1 constitute the vertical structure V2.

The conductor layer 29_1 is provided on the upper surface of the element layer 28_1. The conductor layer 29_1 is used as a read bit line RBL. The conductor layer 29_1 extends in the Y direction.

With the above configuration, the conductor layer 24_1 and the vertical structures V1, V2, and V3 function as one memory cell MC having three terminals coupled to the conductor layers 21_1, 26_1, and 29_1, respectively.

The structure L2 has the same overall structure as the structure L1. That is, the conductor layers 21_2, 23_2, 24_2, 25_2, 26_2, and 29_2, and the element layers 22_2, 27_2, and 28 2 have the same structures and functions as the conductor layers 21_1, 23_1, 24_1, 25_1, 26_1, and 29_1, and the element layers 22_1, 27_1, and 28_1, respectively. As a result, a conductor layer 24_2 and the vertical structures V1, V2, and V3 function as one memory cell MC having three terminals coupled to the conductor layers 21_2, 26_2, and 29_2, respectively.

1.1.3 Magnetoresistance Effect Element and Peripheral Wiring

Figure 5:
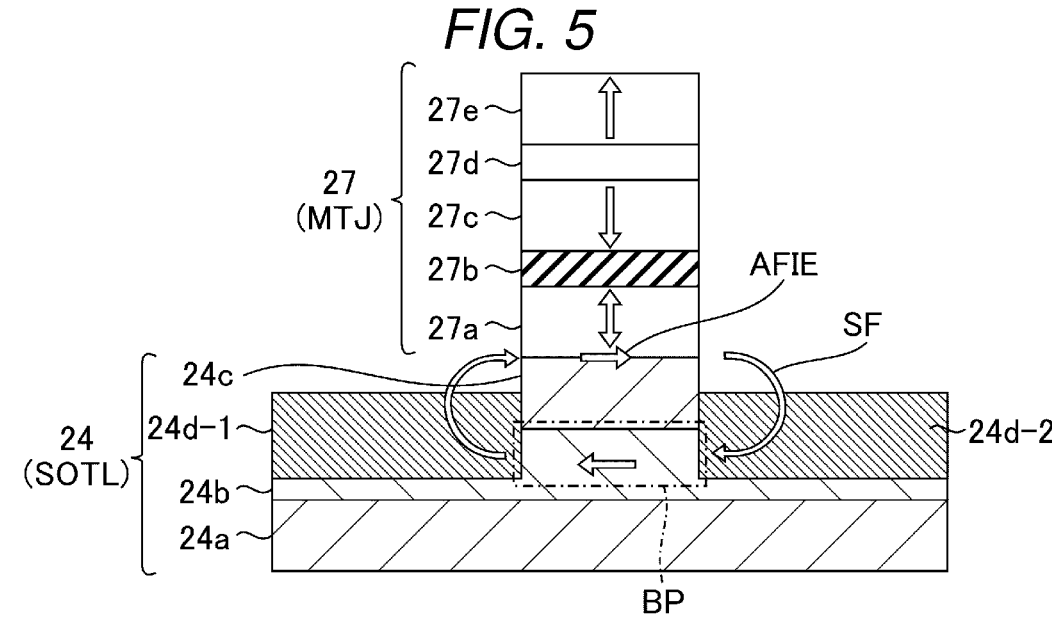
FIG. 5 is a cross-sectional view of a magnetoresistance effect element and a peripheral wiring according to an embodiment.
Figure 5:
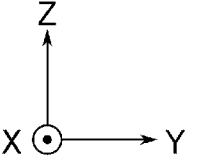
Figure 6:
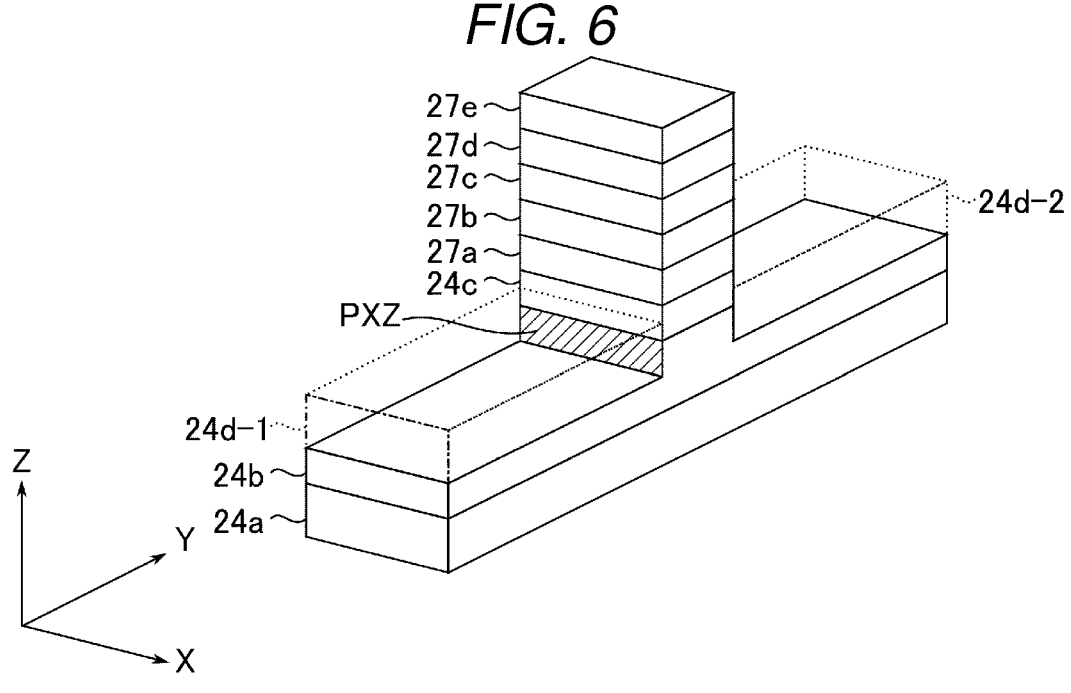
FIG. 6 is a perspective view of a magnetoresistance effect element and a peripheral wiring according to an embodiment.

FIG. 5 is a cross-sectional view of the region V of FIG. 4, illustrating an example of the cross-sectional structure of the magnetoresistance effect element and the peripheral wiring according to the embodiment. FIG. 6 is a perspective view illustrating an example of the structure of the magnetoresistance effect element and the peripheral wiring according to the embodiment. The conductor layer 24 includes an anti-ferromagnetic layer 24a, a ferromagnetic layer 24b, a non-magnetic layer 24c, and a non-magnetic layer 24d. The element layer 27 includes a ferromagnetic layer 27a, a non-magnetic layer 27b, a ferromagnetic layer 27c, a non-magnetic layer 27d, and a ferromagnetic layer 27e. In FIG. 6, the non-magnetic layer 24d is illustrated by a broken line.

First, the details of the structure of the conductor layer 24 will be described.

The anti-ferromagnetic layer 24a is a conductive film having antiferromagnetism. The anti-ferromagnetic layer 24a is coupled with the ferromagnetic layer 24b through exchange coupling. As a result, the anti-ferromagnetic layer 24a fixes the magnetization direction of the ferromagnetic layer 24b in one direction. The anti-ferromagnetic layer 24a comprises, for example, platinum manganese (PtMn). For preventing current shunting, the film thickness of the anti-ferromagnetic layer 24a is preferably thin. For example, the film thickness of the anti-ferromagnetic layer 24a is preferably 10 nanometers (nm) or less. The film thickness of the anti-ferromagnetic layer 24a is more preferably 5 nm or less. When the magnetization direction of the ferromagnetic layer 24b is controlled by shape anisotropy and induced magnetic anisotropy by heat treatment or magnetization application, the anti-ferromagnetic layer 24a may not be provided from the viewpoint of preventing current shunting.

The ferromagnetic layer 24b is provided on the upper surface of the anti-ferromagnetic layer 24a. The ferromagnetic layer 24b is a conductive film having ferromagnetism. The ferromagnetic layer 24b contains, as a ferromagnetic material, at least one element selected from Iron (Fe), Cobalt (Co), Nickel (Ni), and Gadolinium (Gd). The ferromagnetic layer 24b has an axial direction for easy magnetization in the extending direction (Y direction) of the ferromagnetic layer 24b. The magnetization direction of the ferromagnetic layer 24b is stabilized along the Y direction by exchange coupling with the anti-ferromagnetic layer 24a in addition to shape anisotropy. The magnetization direction of the ferromagnetic layer 24b is reversed according to the direction of the current flowing in the ferromagnetic layer 24b. From the viewpoint of preventing current shunting, the film thickness of the ferromagnetic layer 24b is preferably thin. For example, the film thickness of the ferromagnetic layer 24b is preferably 3 nm or less. The film thickness of the ferromagnetic layer 24b is more preferably 1 nm to 2 nm or less. For preventing current shunting, the ferromagnetic layer 24*b* preferably has a high resistance. For example, the crystal structure of the ferromagnetic layer 24*b* is preferably an amorphous structure.

The central portion of the ferromagnetic layer 24*b* corresponding to the third portion of the wiring SOTL is higher in the Z direction with respect to both end portions sandwiching the central portion. That is, the central portion of the ferromagnetic layer 24*b* has a portion (projecting portion BP; see FIG. 5) that projects upward in the Z direction beyond the outer end portions. The shape of the projecting portion BP of the ferromagnetic layer 24*b* is a rectangular parallelepiped. Therefore, the projecting portion BP of the ferromagnetic layer 24*b* has a side surface PXZ (see hatched surface in FIG. 6) parallel to the XZ plane. A leakage magnetic field SF is generated from the side surface PXZ of the ferromagnetic layer 24*b*.

The ferromagnetic layer 24*b* includes a heavy metal.

Specifically, in this example, the ferromagnetic layer 24*b* contains, as a heavy metal, at least one element selected from Neodymium (Nd), Samarium (Sm), Europium (Eu), Terbium (Tb), Dysprosium (Dy), and Holmium (Ho). By inclusion of such a heavy metal element, the ferromagnetic layer 24*b* tends to be in an amorphous phase, and high resistance is expected.

The ferromagnetic layer 24*b* may be a single thin film layer comprising the above-mentioned alloy of the ferromagnetic material and the heavy metal. When the ferromagnetic layer 24*b* is a thin film, the ferromagnetic layer 24*b* typically has an amorphous structure.

The ferromagnetic layer 24*b* may be a stack of films including a layer comprising a ferromagnetic material and a layer comprising a heavy metal stacked on each other. When the ferromagnetic layer 24*b* is a stacked film, at least the layer with the heavy metal has an amorphous structure.

From the viewpoint of improving the adhesion of the film, an underlayer may be provided on the lower surface (semiconductor substrate 20 side) of the anti-ferromagnetic layer 24*a,* or on the lower surface (semiconductor substrate 20 side) of the ferromagnetic layer 24*b* when the anti-ferromagnetic layer 24*a* is not provided. For example, the adhesion promoting underlayer comprises tantalum (Ta), tungsten (W), titanium (Ti), titanium nitride (TiN) or the like. The film thickness such a base layer is preferably 3 nm or less.

The non-magnetic layer 24*c* is provided on the upper surface of the central portion (projecting portion BP) of the ferromagnetic layer 24*b*. The non-magnetic layer 24*c* is a conductive film made of a non-magnetic heavy metal. In this example, the non-magnetic layer 24*c* comprises at least one element selected from ruthenium (Ru), iridium (Ir), rhodium (Rh), and osmium (Os).

The non-magnetic layer 24*c* mainly generates the spin orbit torque (SOT) due to the current flowing inside. In order to obtain a large spin orbit torque, it is required to increase the current flowing through the non-magnetic layer 24*c,* that is, to increase the current density. Therefore, it is required to minimize the current shunting to the other layers, particularly the anti-ferromagnetic layer 24*a* and the ferromagnetic layer 24*b*. The spin orbit torque is injected into the ferromagnetic layer 27*a*. The non-magnetic layer 24*c* anti-ferromagnetically couples the ferromagnetic layer 24*b* and the ferromagnetic layer 27*a* through interlayer exchange coupling.

The non-magnetic layer 24*c* has, for example, a film thickness of 3 nanometers (nm) or less in the Z direction. From the viewpoint of generating anti-ferromagnetic interlayer exchange coupling, the film thickness of the nonmagnetic layer 24*c* is preferably 2 nm or less. More specifically, when the non-magnetic layer 24*c* comprises ruthenium (Ru), the film thickness of the non-magnetic layer 24*c* is preferably 0.4 nm to 0.6 nm, or 0.8 nm to 1.2 nm. When the non-magnetic layer 24*c* comprises iridium (Ir), the film thickness of the non-magnetic layer 24*c* is preferably 0.4 nm to 0.6 nm, or 1.2 nm to 1.6 nm. When the non-magnetic layer 24*c* comprises rhodium (Rh), the film thickness of the non-magnetic layer 24*c* is preferably 0.6 nm to 1.0 nm, or 1.6 nm to 2.0 nm. When the non-magnetic layer 24*c* comprises osmium (Os), the film thickness of the non-magnetic layer 24*c* is preferably 0.8 nm to 1.2 nm. When the non-magnetic layer 24*c* is an alloy comprising at least two elements selected from ruthenium (Ru), iridium (Ir), rhodium (Rh), and osmium (Os), the energy of the anti-ferromagnetic interlayer exchange coupling and the film thickness that maximizes the energy can be controlled by the combination of selected elements and the like.

The non-magnetic layer 24*d* is provided on the upper surfaces of both end portions of the ferromagnetic layer 24*b,* on the side surface of the central portion (projecting portion BP) of the ferromagnetic layer 24*b,* and on a part of the side surface of the non-magnetic layer 24*c*. The upper surface of the non-magnetic layer 24*d* is located at a height lower in the Z direction than the upper surface of the non-magnetic layer 24*c*. The lower surface of the non-magnetic layer 24*d* is located at a height lower in the Z direction than the lower surface of the non-magnetic layer 24*c*.

The non-magnetic layer 24*d* is a conductive film made of a non-magnetic alloy. The non-magnetic layer 24*d* has an amorphous structure. The non-magnetic layer 24*d* is formed by mixing a ferromagnetic material of the ferromagnetic layer 24*b* and a heavy metal of the non-magnetic layer 24*c*. Therefore, the non-magnetic layer 24*d* comprises at least one element selected from Ruthenium (Ru), Iridium (Ir), Rhodium (Rh), and Osmium (Os) and at least one element selected from Iron (Fe), Cobalt (Co), Nickel (Ni), and Gadolinium (Gd). The non-magnetic layer 24*d* may further comprise at least one element selected from Neodymium (Nd), Samarium (Sm), Europium (Eu), Terbium (Tb), Dysprosium (Dy), and Holmium (Ho).

At least one element selected from ruthenium (Ru), iridium (Ir), rhodium (Rh), and osmium (Os) in the conductor layer 24 is distributed to a height lower in the Z direction in the portion where the non-magnetic layer 24*d* is provided than in the portion where the non-magnetic layer 24*c* is provided. At least one element selected from iron (Fe), cobalt (Co), nickel (Ni), and gadolinium (Gd) in the conductor layer 24 is distributed up to a height higher in the Z direction in the portion where the non-magnetic layer 24*d* is provided than in the portion where the non-magnetic layer 24*c* is provided. At least one element selected from neodymium (Nd), samarium (Sm), europium (Eu), terbium (Tb), dysprosium (Dy), and holmium (Ho) in the conductor layer 24 is distributed up to a height higher in the Z direction in the portion where the non-magnetic layer 24*d* is provided than in the portion where the non-magnetic layer 24*c* is provided.

The non-magnetic layer 24*d* includes non-magnetic layers 24*d*-1 and 24*d*-2. The non-magnetic layer 24*d*-1 is provided on one upper surface of both end portions of the ferromagnetic layer 24*b*. The non-magnetic layer 24*d*-2 is provided on the other upper surface of both end portions of the ferromagnetic layer 24*b*. The non-magnetic layers 24*d*-1 and 24*d*-2 are physically separated from each other via the projecting portion BP of the ferromagnetic layer 24*b* and the non-magnetic layer 24*c*.

The ferromagnetic layer 27a is provided on the upper surface of the non-magnetic layer 24c. The ferromagnetic layer 27a is a conductive film having ferromagnetism. The ferromagnetic layer 27a is used as a storage layer. The ferromagnetic layer 27a has an axial direction for easy magnetization in a direction perpendicular to the film surface (Z direction). A bias magnetic field AFIE in the Y direction is applied to the ferromagnetic layer 27a at the interface with the non-magnetic layer 24c by the interlayer exchange coupling with the ferromagnetic layer 24b via the non-magnetic layer 24c. The direction of the bias magnetic field AFIE is anti-parallel to the magnetization direction of the ferromagnetic layer 24b. The direction of the bias magnetic field AFIE is parallel to the direction of the leakage magnetic field SF acting on the ferromagnetic layer 27a. Therefore, the bias magnetic field AFIE and the leakage magnetic field SF act on the ferromagnetic layer 27a so as to strengthen each other. The leakage magnetic field from the ferromagnetic layer 27a is also generated from the end portion of the wiring SOTL. The direction of the leakage magnetic field from the end portion of the wiring SOTL is parallel to the direction of the bias magnetic field AFIE, as is the direction of the leakage magnetic field SF. Therefore, in addition to the bias magnetic field AFIE and the leakage magnetic field SF, the leakage magnetic field from the end portion of the wiring SOTL acts on the ferromagnetic layer 27a so as to further strengthen each other. The spin orbit torque generated in the non-magnetic layer 24c is injected into the ferromagnetic layer 27a. The magnetization direction of the ferromagnetic layer 27a is configured to be reversed based on the sum of the bias magnetic field AFIE and the leakage magnetic field SF in the Y direction and the spin orbit torque.

The ferromagnetic layer 27a comprises iron (Fe). The ferromagnetic layer 27a may further comprise at least one of cobalt (Co) and nickel (Ni). The ferromagnetic layer 27a may additionally comprise boron (B). More specifically, for example, the ferromagnetic layer 27a is iron cobalt boron (FeCoB) or iron boride (FeB).

For increasing the retention energy for data retention, the ferromagnetic layer 27a may include a stacked film of a layer A and a layer B. The layer A is a layer comprising at least one element selected from cobalt (Co), iron (Fe), and nickel (Ni). The layer B is a layer comprising at least one element selected from platinum (Pt), iridium (Ir), palladium (Pd), and gold (Au). Examples of the stacked film include a Co/Pt stacked film, a Co/Ir stacked film, a Co/Pd stacked film, and the like. The stacked film is further stacked with a layer C comprising iron cobalt boron (FeCoB). In this case, the stacked film is provided to be in contact with the non-magnetic layer 24c and the layer C to be in contact with the non-magnetic layer 27b.

The non-magnetic layer 27b is provided on the upper surface of the ferromagnetic layer 27a. The non-magnetic layer 27b is a non-magnetic insulating film. The non-magnetic layer 27b is used as a tunnel barrier layer. The non-magnetic layer 27b is provided between the ferromagnetic layer 27a and the ferromagnetic layer 27c, and forms a magnetic tunnel junction together with these two ferromagnetic layers. The non-magnetic layer 27b functions as a seed material for growing a crystalline film at the interface with the ferromagnetic layer 27a in the crystallization treatment of the ferromagnetic layer 27a. The non-magnetic layer 27b has a NaCl crystal structure in which the film surface is oriented toward the (001) surface. The non-magnetic layer 27b comprises, for example, magnesium oxide (MgO).

The ferromagnetic layer 27c is provided on the upper surface of the non-magnetic layer 27b. The ferromagnetic layer 27c is a conductive film having ferromagnetism. The ferromagnetic layer 27c is used as a reference layer. The ferromagnetic layer 27c has an axial direction for easy magnetization in a direction perpendicular to the film surface (Z direction). The magnetization direction of the ferromagnetic layer 27c is fixed. In the example of FIG. 5, the magnetization direction of the ferromagnetic layer 27c is directed to the direction of the ferromagnetic layer 27a. The phrase "the magnetization direction is fixed" means that the magnetization direction does not change due to a torque having a magnitude that can reverse the magnetization direction of the ferromagnetic layer 27a. In this example, the ferromagnetic layer 27c comprises at least one compound selected from cobalt platinum (CoPt), cobalt nickel (CoNi), and cobalt palladium (CoPd).

The non-magnetic layer 27d is provided on the upper surface of the ferromagnetic layer 27c. The non-magnetic layer 27d is a non-magnetic conductive film. The non-magnetic layer 27d is used as a spacer layer. In this example, non-magnetic layer 27d comprises at least one element selected from ruthenium (Ru), osmium (Os), rhodium (Rh), iridium (Ir), vanadium (V), and chromium (Cr). The film thickness of the non-magnetic layer 27d is 2 nm or less.

The ferromagnetic layer 27e is provided on the upper surface of the non-magnetic layer 27d. The ferromagnetic layer 27e is a conductive film having ferromagnetism. The ferromagnetic layer 27e is used as a shift cancelling layer. The ferromagnetic layer 27e has an axial direction for easy magnetization in a direction perpendicular to the film surface (Z direction). In this example, ferromagnetic layer 27e comprises at least one compound selected from cobalt platinum (CoPt), cobalt nickel (CoNi), and cobalt palladium (CoPd).

The ferromagnetic layer 27c and the ferromagnetic layer 27e are anti-ferromagnetically coupled by the non-magnetic layer 27d. That is, the ferromagnetic layer 27c and the ferromagnetic layer 27e are coupled to have magnetization directions anti-parallel to each other. Such a coupling structure of the ferromagnetic layer 27c, the non-magnetic layer 27d, and the ferromagnetic layer 27e is called a synthetic anti-ferromagnetic (SAF) structure. Due to the SAF structure, the ferromagnetic layer 27e can cancel the influence of the leakage magnetic field of the ferromagnetic layer 27c on the magnetization direction of the ferromagnetic layer 27a.

The magnetoresistance effect element MTJ can take either a low resistance state or a high resistance state depending on whether the relative relationship between the magnetization directions of the storage layer and the reference layer is parallel or anti-parallel. In the embodiment, the magnetization direction of the storage layer with respect to the magnetization direction of the reference layer is controlled without passing a write current through such a magnetoresistance effect element MTJ. Specifically, a writing method using the spin orbit torque generated by passing a current through the wiring SOTL is adopted.

When a write current Ic0 of a certain magnitude is passed through the wiring SOTL in the Y direction, the relative relationship between the magnetization directions of the storage layer and the reference layer becomes parallel. In this parallel state, the resistance value of the magnetoresistance effect element MTJ is the lowest, and the magnetoresistance effect element MTJ is set to a low resistance state. This low resistance state is called a "P (parallel) state" and is defined as, for example, a state for data "0".

When a write current Ic1 larger than the write current Ic0 is passed through the wiring SOTL in the direction opposite to the write current Ic0, the relative relationship between the magnetization directions of the storage layer and the reference layer becomes anti-parallel. In this anti-parallel state, the resistance value of the magnetoresistance effect element MTJ is highest, the magnetoresistance effect element MTJ is set to a high resistance state. This high resistance state is called an "AP (anti-parallel) state" and is defined as, for example, a state for data "1".

The method of defining data "1" and data "0" is not limited to the above-mentioned example. For example, the P state may be defined as data "1" and the AP state may be defined as data "0".

1.2 Operation

Figure 7:
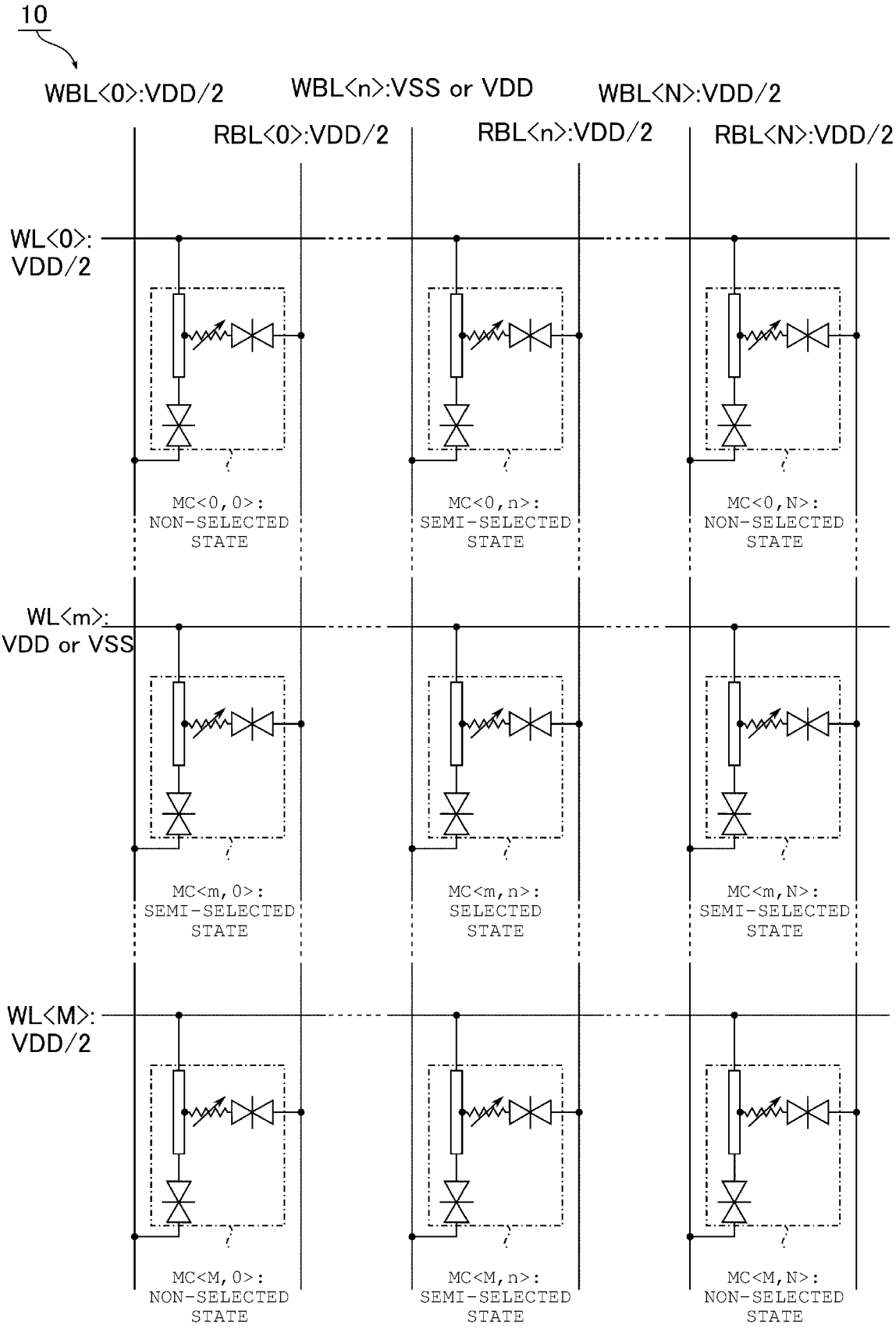
FIG. 7 is a circuit view related to a write operation in a magnetic memory device according to an embodiment.

FIG. 7 is a circuit view illustrating an example of a write operation in a magnetic memory device according to the embodiment. In the example of FIG. 7, a case where data is written into the memory cell MC<m,n> among the plurality of memory cells MC is illustrated (0<m<M, 0<n<N).

When data is written into the memory cell MC<m,n>, a voltage VDD or VSS is applied to each of the word line WL<m> and the write bit line WBL<n>. When the voltage VDD is applied to the word line WL<m>, the voltage VSS is applied to the write bit line WBL<n>. When the voltage VSS is applied to the word line WL<m>, the voltage VDD is applied to the write bit line WBL<n>. A voltage VDD/2 is applied to all the word lines WL other than the word line WL<m>, all the write bit lines WBL other than the write bit line WBL<n>, and all the read bit lines RBL.

The voltage VSS is a reference potential. The voltage VSS is, for example, 0 V. The voltage VDD (potential difference VDD) with respect to the voltage VSS is a voltage that turns on the switching elements SEL1 and SEL2. The potential difference VDD is a voltage at which a current can be passed to change the resistance state of the magnetoresistance effect element MTJ. The potential difference VDD/2 is a voltage that turns off the switching elements SEL1 and SEL2.

As a result, the potential difference VDD is generated between the word line WL<m> and the write bit line WBL<n>. A potential difference VDD/2 is generated between the word line WL<m> and any write bit line WBL other than the write bit line WBL<n>. A potential difference VDD/2 is generated between the word line WL<m> and any read bit line RBL.

A potential difference VDD/2 is generated between any word line WL other than the word line WL<m> and the write bit line WBL<n>. No potential difference is generated between any word line WL other than the word line WL<m> and any write bit line WBL other than the write bit line WBL<n>. No potential difference is generated between any word line WL other than the word line WL<m> and any read bit line RBL.

A potential difference VDD/2 is generated between the write bit line WBL<n> and the read bit line RBL<n>. No potential difference is generated between any write bit line WBL other than the write bit line WBL<n> and the corresponding read bit line RBL.

Therefore, a switching element SEL1<m,n>is turned on. All the switching elements SEL1 other than the switching element SEL1<m,n> are turned off and all the switching elements SEL2 are turned off.

Therefore, it is possible to pass a current through the wiring SOTL<m,n> without passing a current through all the wirings SOTL other than the wiring SOTL<m,n> and all the magnetoresistance effect elements MTJ.

In the above-mentioned write operation, the state of the memory cell MC<m,n> is also called a selected state. The state of the memory cells MC<0,n>to MC<m−1,n>, MC<m+1,n> to MC<m,n>, MC<m,0> to MC<m,n−1>, and MC<m,n+1> to MC<m,n> is also called a semi-selected state. The state of all the memory cells MC that are not in a selected state or a semi-selected state is also called a non-selected state.

Figure 8:
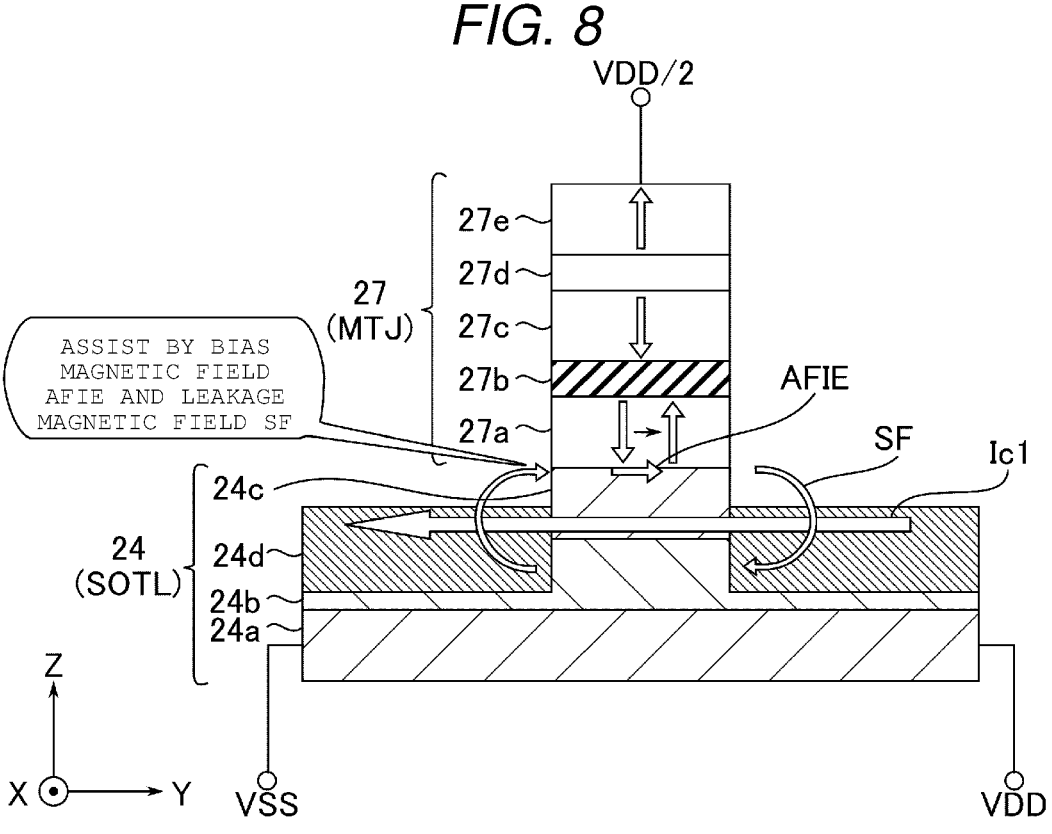
FIG. 8 is a cross-sectional view related to a write operation in a magnetic memory device according to an embodiment.
Figure 9:
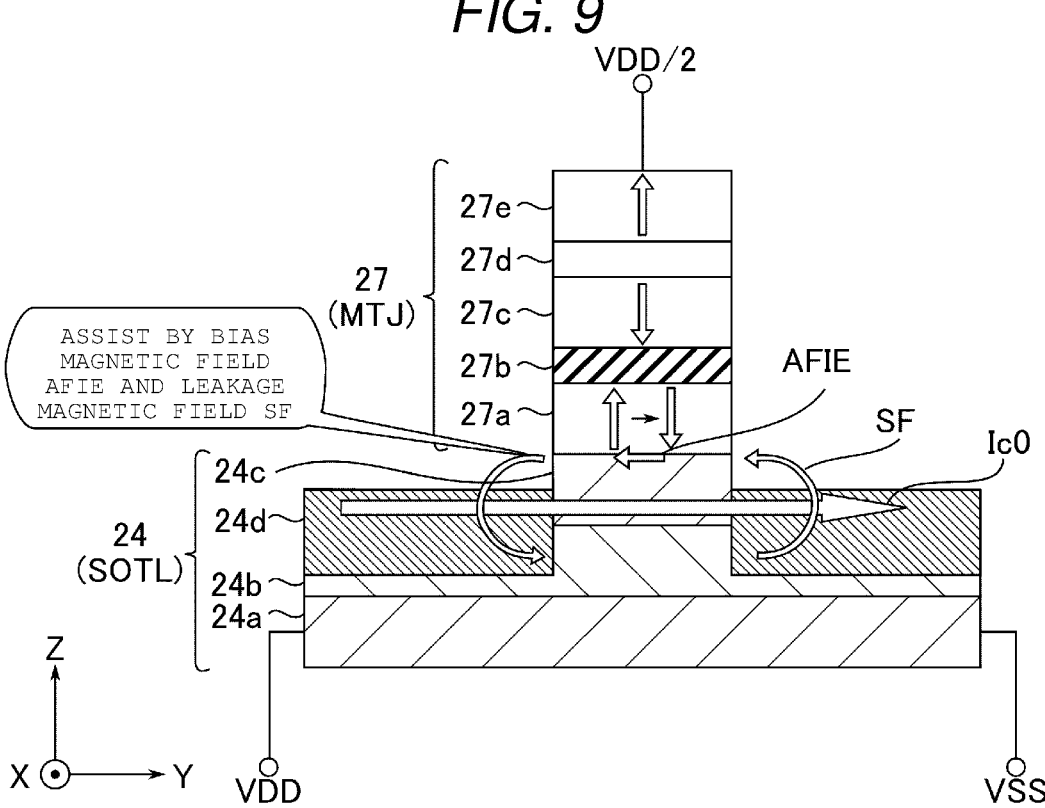
FIG. 9 is a cross-sectional view related to a write operation in a magnetic memory device according to an embodiment.

FIGS. 8 and 9 are cross-sectional views illustrating an example of a write operation in the magnetic memory device according to the embodiment. FIGS. 8 and 9 schematically illustrate the current flowing through the selected memory cell MC and the magnetization direction of the magnetoresistance effect element MTJ. FIG. 8 corresponds to a write operation when writing data "1". FIG. 9 corresponds to a write operation when writing data "0".

First, the operation of writing data "1" will be described with reference to FIG. 8. In the example of FIG. 8, a case where the write current Ic1 flows from the word line WL (right side of the paper surface) to the write bit line WBL (left side of the paper surface) is illustrated.

As described above, a potential difference VDD that turns on the switching element SEL1 is generated at both ends of the conductor layer 24. By controlling the potential difference VDD, the write current Ic1 flows in the conductor layer 24. When the write current Ic1 flows in the conductor layer 24, particularly in the non-magnetic layer 24c, a spin orbit torque is generated that attempts to make the magnetization direction of the ferromagnetic layer 27a anti-parallel to the magnetization direction of the ferromagnetic layer 27c. The spin orbit torque is injected into the ferromagnetic layer 27a, which is close to the non-magnetic layer 24c.

The magnetization directions of the ferromagnetic layer 24b are aligned with the flow direction of the write current Ic1. Therefore, the bias magnetic field AFIE in the Y direction generated by the interlayer exchange coupling with the ferromagnetic layer 24b via the non-magnetic layer 24c is applied to the ferromagnetic layer 27a. In addition, the leakage magnetic field SF generated from the projecting portion BP of the ferromagnetic layer 24b is applied to the ferromagnetic layer 27a in a direction parallel to the bias magnetic field AFIE.

As a result, the magnetization direction of the ferromagnetic layer 27a is reversed in a direction anti-parallel to the magnetization direction of the ferromagnetic layer 27c by the spin orbit torque and the assist by the sum of the bias magnetic field AFIE and the leakage magnetic field SF.

In this case, for easy and precise control of the leakage magnetic field SF from the magnetic layer 24b, it may be better that that the magnetic layer 24b should have the synthetic anti-ferromagnetic (SAF) structure, that is, a stacked layer structure that corresponds to: a lower ferromagnetic layer/intermediated non-magnetic layer)/upper ferromagnetic layer rather than just a single ferromagnetic layer structure. With a SAF-type structure, the upper and lower ferromagnetic layers are directly connected to the nonmagnetic layer 24c and the anti-ferromagnetic layer 24a. With a SAF structure, the leakage magnetic field of the lower ferromagnetic layer can controllably reduce the influence of the leakage magnetic field of the upper ferromagnetic layer on the ferromagnetic layer 27a of the MTJ to control the leakage field strength more precisely. In this case, the intermediated nonmagnetic layer can preferably be Cr, Ru, Ir or Os, and the upper and lower ferromagnetic layers should include at least one of Co, Fe or Ni. In general, amorphous material, such as CoB, CoFeB and NiFeB, is better for these purposes.

Next, the writing of data "0" will be described with reference to FIG. 9. In the example of FIG. 9, a case where the write current Ic0 flows from the write bit line WBL (left side of the paper surface) to the word line WL (right side of the paper surface) is illustrated.

As described above, a potential difference VDD that turns on the switching element SEL1 is generated at both ends of the conductor layer 24. By controlling the potential difference VDD, the write current Ic0 flows in the conductor layer 24. When the write current Ic0 flows in the conductor layer 24, particularly in the non-magnetic layer 24*c*, a spin orbit torque is generated that attempts to make the magnetization direction of the ferromagnetic layer 27*a* parallel to the magnetization direction of the ferromagnetic layer 27*c*. The spin orbit torque is injected into the ferromagnetic layer 27*a*, which is close to the non-magnetic layer 24*c*.

The magnetization directions of the ferromagnetic layer 24*b* are aligned with the flow direction of the write current Ic0. Therefore, the bias magnetic field AFIE in the −Y direction generated by the interlayer exchange coupling with the ferromagnetic layer 24*b* via the non-magnetic layer 24*c* is applied to the ferromagnetic layer 27*a*. In addition, the leakage magnetic field SF generated from the projecting portion BP of the ferromagnetic layer 24*b* is applied to the ferromagnetic layer 27*a* in a direction parallel to the bias magnetic field AFIE.

As a result, the magnetization direction of the ferromagnetic layer 27*a* is reversed in a direction parallel to the magnetization direction of the ferromagnetic layer 27*c* by the spin orbit torque and the assist by the sum of the bias magnetic field AFIE and the leakage magnetic field SF.

1.3 Manufacturing Method

Each of FIGS. 10 to 17 illustrate aspects related to a manufacturing process other than the formation of write bit lines WBL, word lines WL, vertical structures V1, and vertical structures V3. The planar layout portion(s) illustrated in FIGS. 10, 12, 14, and 16 corresponds to a subregion of the planar layout illustrated in FIG. 3 that includes one wiring SOTL.

Figure 10:
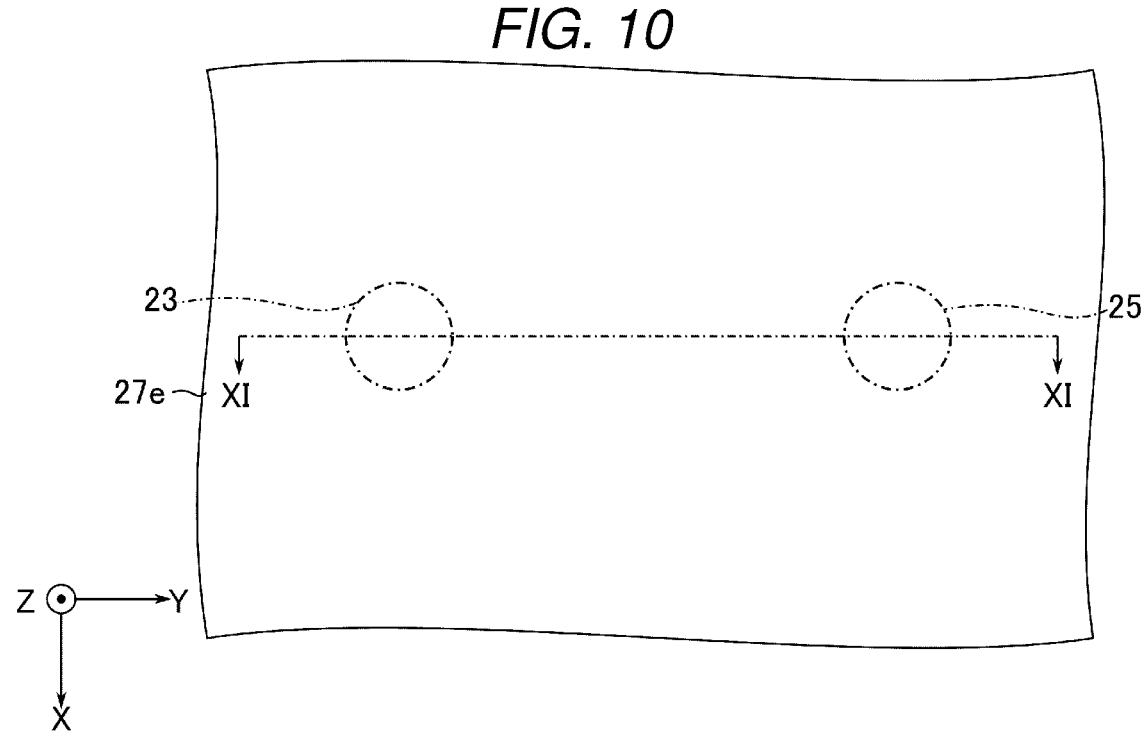
FIG. 10 is a plan view illustrating an example of a planar layout during manufacturing of magnetoresistance effect elements and peripheral wiring according to an embodiment.
Figure 11:
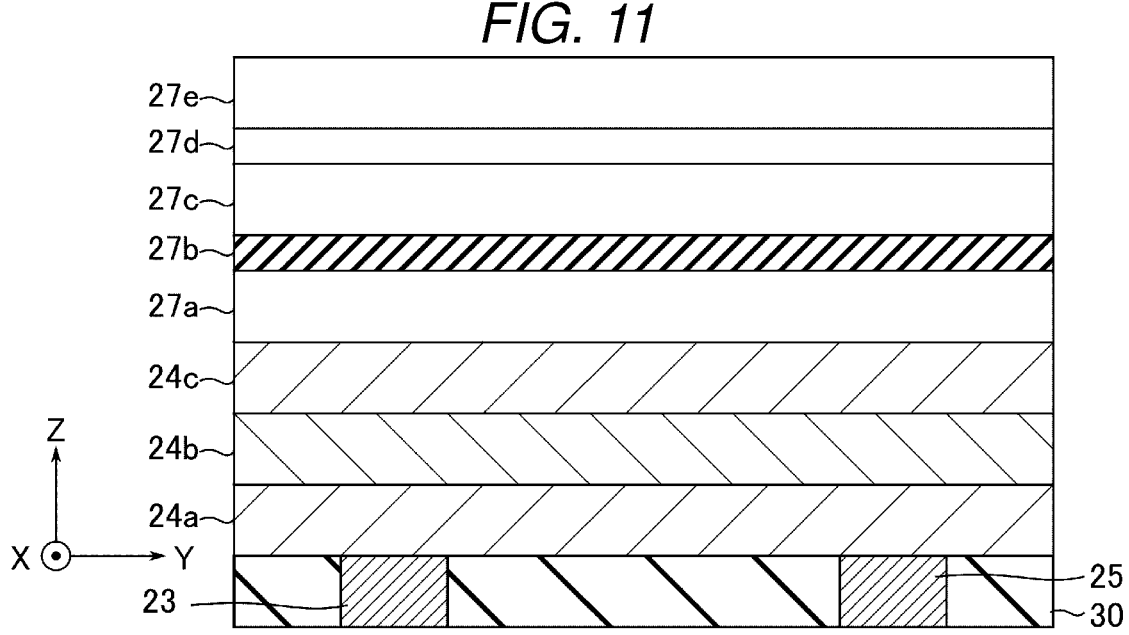
FIG. 11 is a cross-sectional view related to manufacturing of magnetoresistance effect elements and peripheral wiring according to an embodiment.
Figure 12:
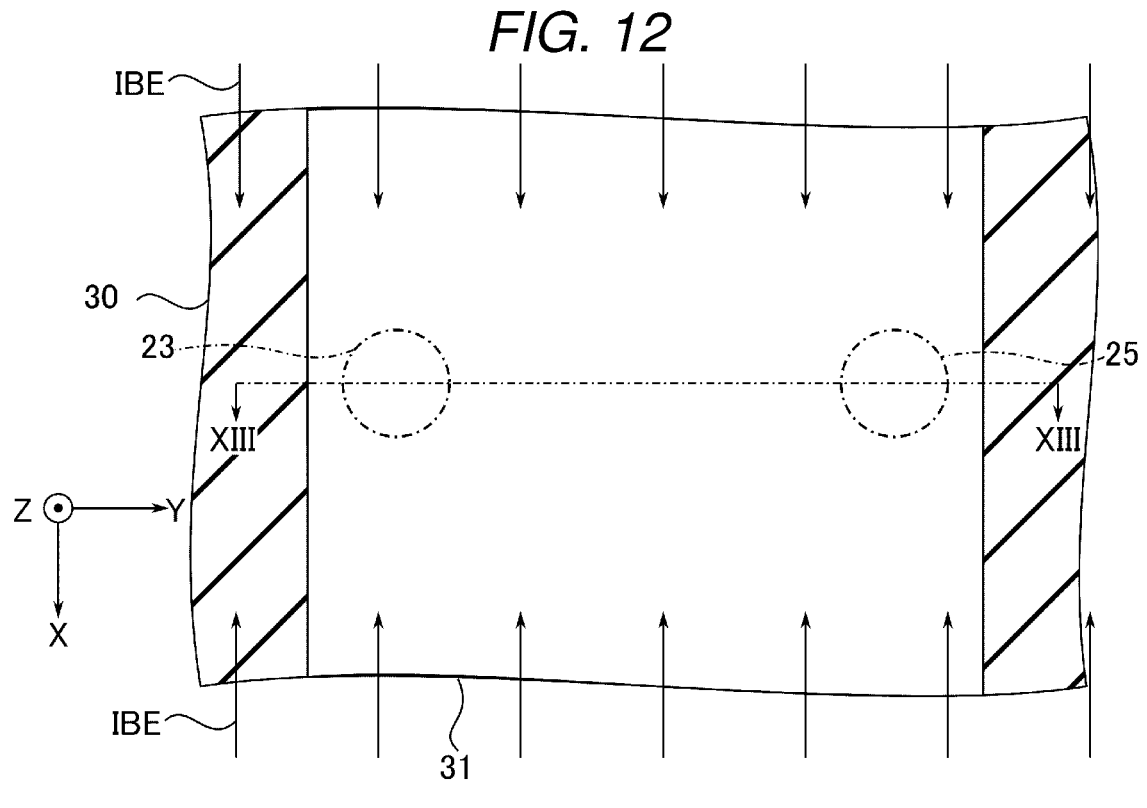
FIG. 12 is a plan view illustrating an example of a planar layout during manufacturing of magnetoresistance effect elements and peripheral wiring according to an embodiment.
Figure 13:
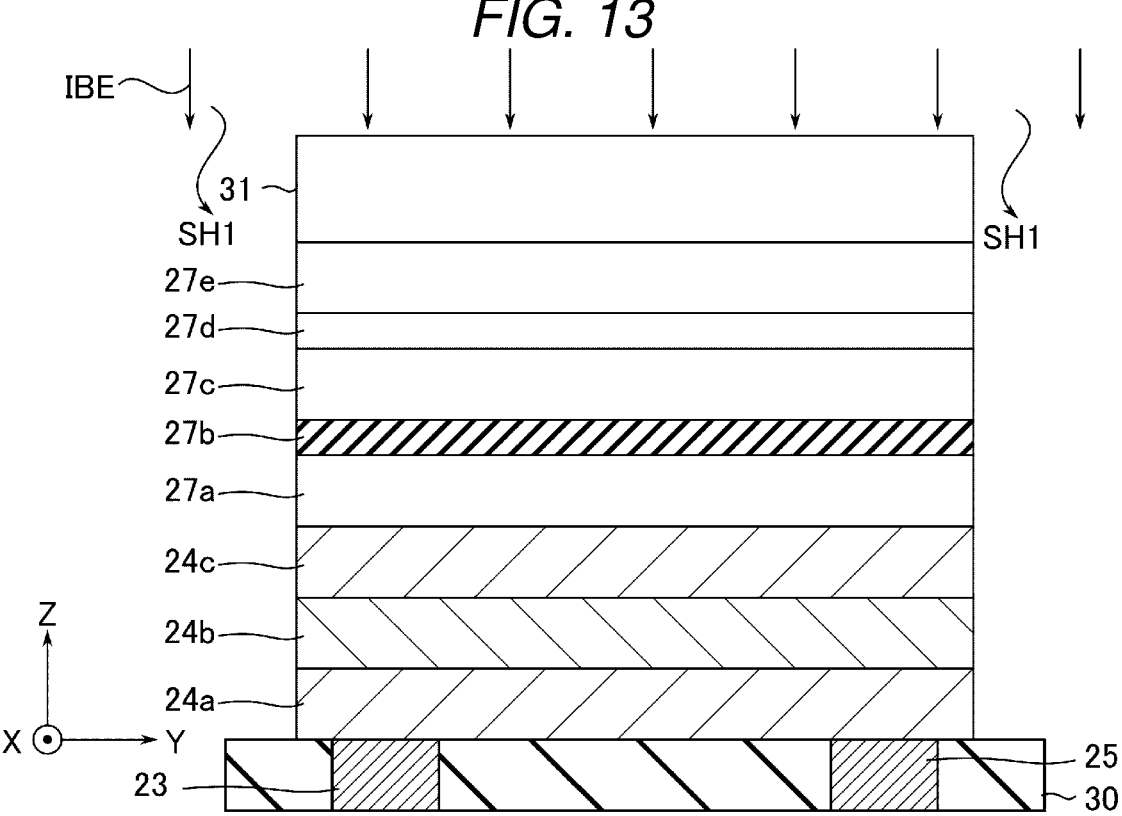
FIG. 13 is a cross-sectional view related to manufacturing of magnetoresistance effect elements and peripheral wiring according to an embodiment.
Figures 14, 15:
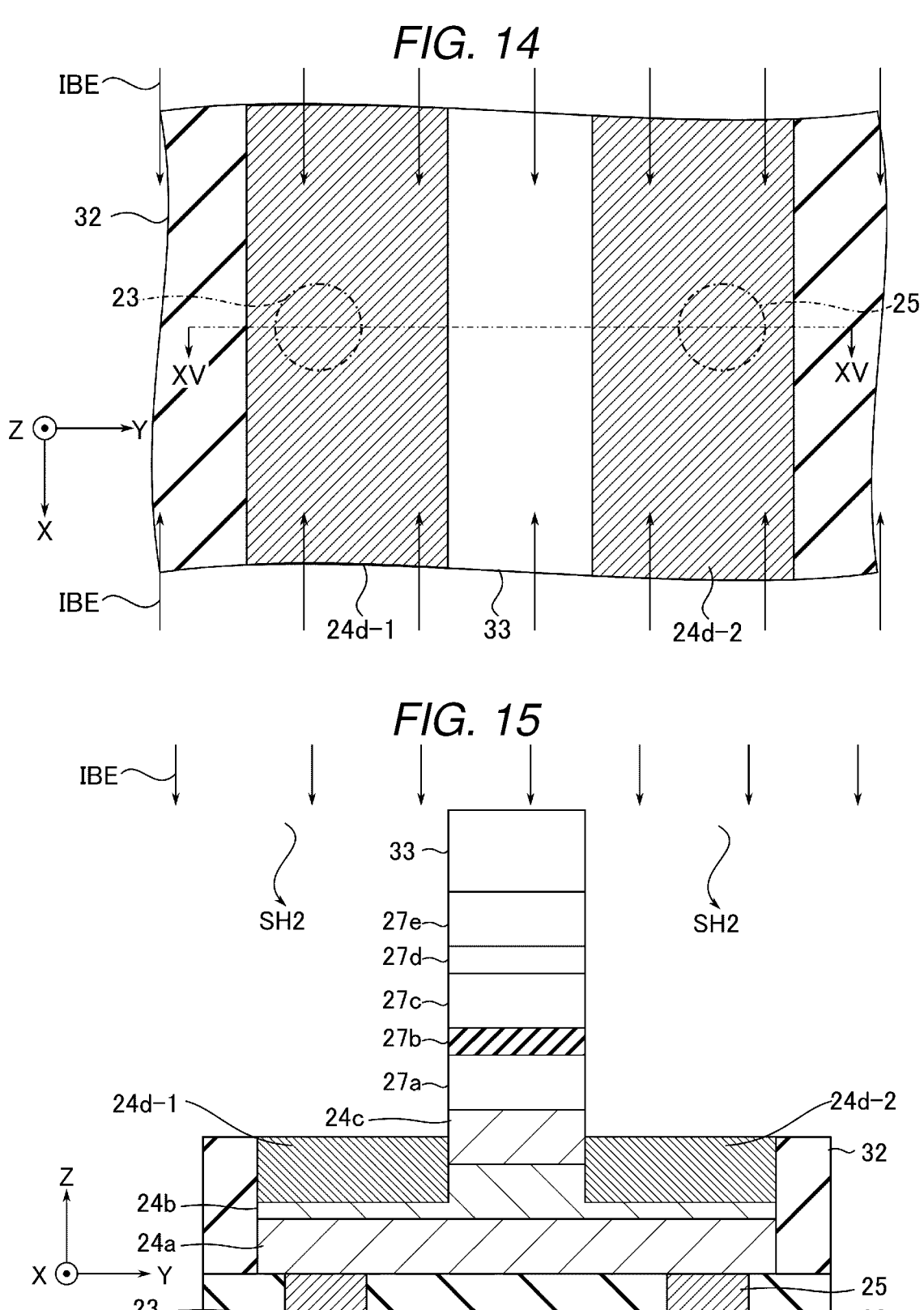
FIG. 14 is a plan view illustrating an example of a planar layout during manufacturing of magnetoresistance effect elements and peripheral wiring according to an embodiment.
FIG. 15 is a cross-sectional view related to manufacturing of magnetoresistance effect elements and peripheral wiring according to an embodiment.
Figure 16:
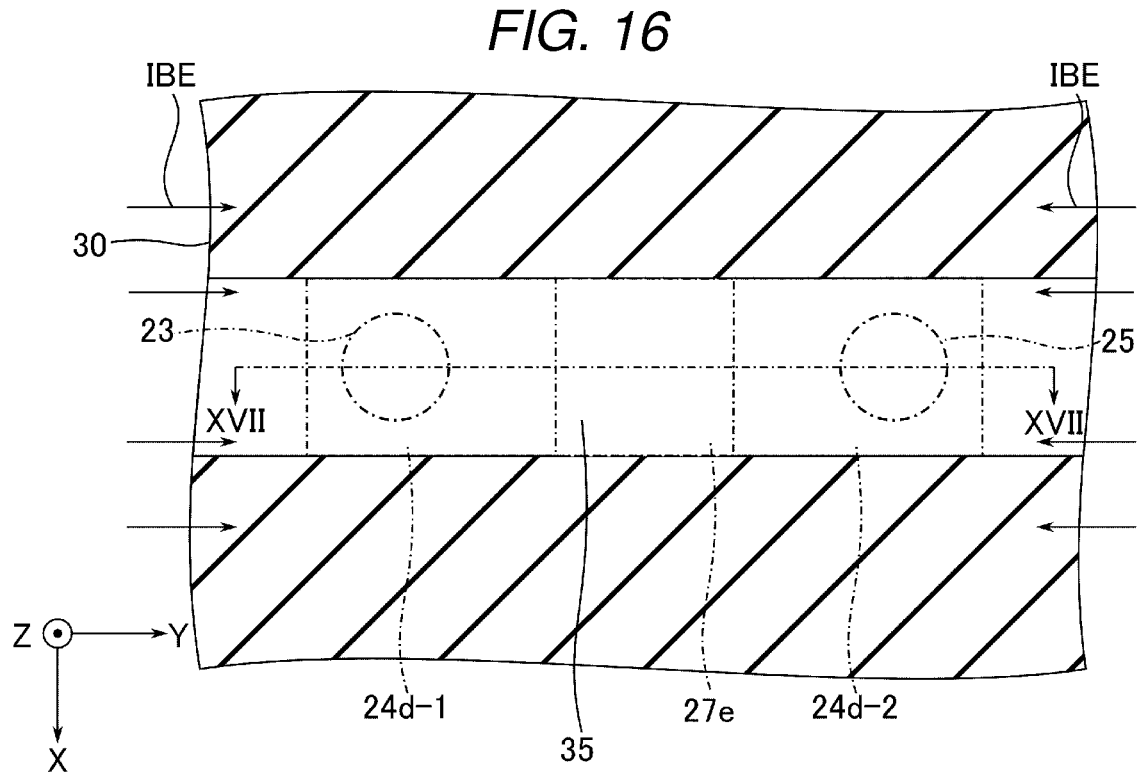
FIG. 16 is a plan view illustrating an example of a planar layout during manufacturing of magnetoresistance effect elements and peripheral wiring according to an embodiment.
Figure 17:
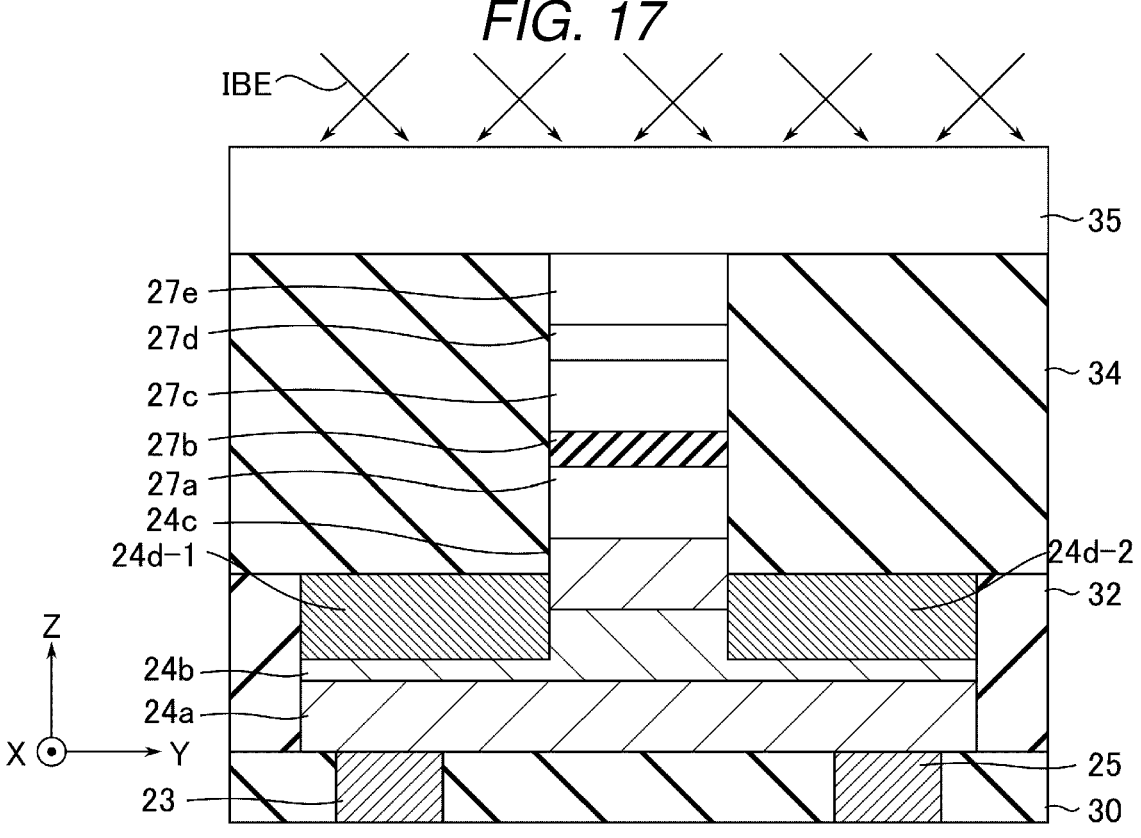
FIG. 17 is a cross-sectional view related to manufacturing of magnetoresistance effect elements and peripheral wiring according to an embodiment.

The cross-sectional structure illustrated in FIG. 11 is a cross-sectional view taken along the line XI-XI of FIG. 10. The cross-sectional structure illustrated in FIG. 13 is a cross-sectional view taken along the line XIII-XIII of FIG. 12. The cross-sectional structure illustrated in FIG. 15 is a cross-sectional view taken along the line XV-XV of FIG. 14. The cross-sectional structure illustrated in FIG. 17 is a cross-sectional view taken along the line XVII-XVII of FIG. 16.

In the following, it is assumed that a plurality of write bit lines WBL, a plurality of word lines WL, a plurality of vertical structures V1, and a plurality of vertical structures V3 have already been formed on the semiconductor substrate 20. The subsequent manufacturing process of the wirings SOTL and the magnetoresistance effect elements MTJ will be described in the following.

The anti-ferromagnetic layer 24*a* is provided on the upper surface of a structure including the plurality of write bit lines WBL, the plurality of word lines WL, the plurality of vertical structures V1, and the plurality of vertical structures V3. The conductor layers 23 and 25 exposed on the upper surface of the structure are electrically coupled to the anti-ferromagnetic layer 24*a*.

Subsequently, as illustrated in FIGS. 10 and 11, the ferromagnetic layer 24*b*, the non-magnetic layer 24*c*, the ferromagnetic layer 27*a*, the non-magnetic layer 27*b*, the ferromagnetic layer 27*c*, the non-magnetic layer 27*d*, and the ferromagnetic layer 27*e* are stacked in this order on the upper surface of the anti-ferromagnetic layer 24*a*.

Subsequently, a mask 31 is formed by photolithography or the like. The mask 31 defines the length of the long dimension (Y direction) of the wiring SOTL and the width of the short dimension (X direction) of the wiring SOTL. Then, as illustrated in FIGS. 12 and 13, by anisotropic etching using the mask 31, a slit SH1 is formed penetrating the ferromagnetic layer 27*e*, the non-magnetic layer 27*d*, the ferromagnetic layer 27*c*, the non-magnetic layer 27*b*, the ferromagnetic layer 27*a*, the non-magnetic layer 24*c*, the ferromagnetic layer 24*b*, and the anti-ferromagnetic layer 24*a*. At the bottom of the slit SH1, a part of the upper surface of the insulator layer 30 is exposed. The insulator layer 30 is an insulating film that covers the sides of the conductor layers 23 and 25 at a level below the anti-ferromagnetic layer 24*a*. The conductors 23 and 25 may be said to be embedded in the insulator layer 30. Physical etching using an ion beam can be applied to the anisotropic etching in this process.

The slit SH1 is then filled by the insulator layer 32. Any portion of insulator layer 32 formed on the upper surface of the ferromagnetic layer 27*e* can be removed by, for example, chemical mechanical polishing (CMP). As a result, the upper surface of the stacked structure is flattened.

Next, a mask 33 is formed by photolithography or the like. The mask 33 defines the dimension of the magnetoresistance effect element MTJ in the Y direction. As illustrated in FIGS. 14 and 15, by anisotropic etching using the mask 33, slits SH2 are formed which trims the end portions of the ferromagnetic layer 27*e*, the non-magnetic layer 27*d*, the ferromagnetic layer 27*c*, the non-magnetic layer 27*b*, and the ferromagnetic layer 27*a*. At the bottom of the slit SH2, the upper surface of the insulator layer 32 and the portion of the conductor layer 24 that is not directly below the mask 33 are exposed. Physical etching using an ion beam is applied to the anisotropic etching in this process.

Here, the portion of the conductor layer 24 that is not directly below the mask 33 is affected by the etching gas used for physical etching being injected and the injected etching gas impinging on and interacting with the elements in the conductor layer 24. As a result, a part of the conductor layer 24 may be etched and the material of the conductor layer 24 (or a portion thereof) can be altered. The film thickness of the non-magnetic layer 24*c* may be 3 nm or less in thickness. Therefore, the influence of the etch gas may extend to a part or all of the ferromagnetic layer 24*b* that is not directly below the mask 33. That is, a portion of the non-magnetic layer 24*c* and a portion of the ferromagnetic layer 24*b* may be deactivated or altered. The non-magnetic layer 24*d* having an amorphous alloy containing elements in the non-magnetic layer 24*c* and elements in the ferromagnetic layer 24*b* may be formed in the portion of the conductor layer 24 that is not directly below the mask 33. The ferromagnetic layer 24*b* thus has a shape having the projecting portion BP directly below the mask 33.

The slit SH2 is embedded by the insulator layer 34. The insulator layer 34 formed on the upper surface of the ferromagnetic layer 27*e* is removed by, for example, CMP. As a result, the upper surface of the stacked structure is flattened.

Next, a mask 35 is formed on the upper surface of the formed structure by photolithography or the like. The mask 35 defines the length of the wiring SOTL and the magnetoresistance effect element MTJ in the X direction. The mask 35 extends in the Y direction. Then, by anisotropic etching using the mask 35 as illustrated in FIGS. 16 and 17, a slit along the Y direction is etched to penetrate the ferromagnetic layer 27e, the non-magnetic layer 27d, the ferromagnetic layer 27c, the non-magnetic layer 27b, the ferromagnetic layer 27a, the non-magnetic layer 24d, the non-magnetic layer 24c, the ferromagnetic layer 24b, and the anti-ferromagnetic layer 24a. At the bottom of this etched slit, a part of the upper surface of the insulator layer 30 is exposed. Physical etching using an ion beam can be used as the anisotropic etching method in this process.

The Y-direction slit is then filled with an insulator material. Any insulator material formed on the upper surface of the ferromagnetic layer 27e can be removed by, for example, CMP. As a result, the upper surface of the stacked structure can be flattened.

By the manufacturing process described above, the shapes of the wiring SOTL and the magnetoresistance effect element MTJ in the memory cell array 10 are formed. The manufacturing process described above is merely an example, and embodiments are not limited thereto. For example, the switching element SEL2 on the magnetoresistance effect element MTJ may be formed at the same time as the magnetoresistance effect element MTJ by the manufacturing process described above.

1.4 Effects

In the first embodiment, a writing method using a spin orbit torque is applied to an MRAM having a magnetoresistance effect element MTJ that has perpendicular magnetization. In this case, it is required to apply a magnetic field bias to the magnetoresistance effect element MTJ. Typically, configurations to generate magnetic field bias can contribute or require additional complexity to the device structure. However, according to the present disclosure, the load of a write operation can be reduced by generating a magnetic field bias while avoiding significant additional device structure complexity.

The wiring SOTL includes a first portion coupled to the word line WL, a second portion coupled to the write bit line WBL, and a third portion coupled to the read bit line RBL. The magnetoresistance effect element MTJ is coupled between the third portion of the wiring SOTL and the read bit line RBL. The switching element SEL1 is coupled between the second portion of the wiring SOTL and the write bit line WBL. The switching element SEL2 is coupled between the magnetoresistance effect element MTJ and the read bit line RBL. This makes it possible to configure the memory cell MC to which the writing method using the spin orbit torque is applied.

The wiring SOTL includes the ferromagnetic layer 24b and the non-magnetic layer 24c provided between the ferromagnetic layer 24b and the magnetoresistance effect element MTJ. The non-magnetic layer 24c comprises at least one element selected from ruthenium (Ru), iridium (Ir), rhodium (Rh), and osmium (Os), and has a film thickness of 3 nanometers or less. As a result, the non-magnetic layer 24c can apply the bias magnetic field AFIE in the direction opposite to the current direction to the ferromagnetic layer 27a while generating a spin orbit torque by the current flowing through the wiring SOTL.

Therefore, a write operation can be performed without generating an external magnetic field. Therefore, the load of a write operation can be reduced.

The ferromagnetic layer 24b comprises at least one ferromagnetic element selected from iron (Fe), cobalt (Co), nickel (Ni), and gadolinium (Gd), and an element having at least a high orbital angular momentum selected from neodymium (Nd), samarium (Sm), europium (Eu), terbium (Tb), dysprosium (Dy), and holmium (Ho). As a result, it is possible to assist the generation of a spin orbit torque in the non-magnetic layer 24c while generating the bias magnetic field AFIE.

The ferromagnetic layer 24b is an amorphous alloy. Thereby, the flatness of the wiring SOTL can be improved. Therefore, the flatness of the magnetoresistance effect element MTJ provided directly above the wiring SOTL can be ensured. In addition, electron scattering of heavy elements in the ferromagnetic layer 24b can be enhanced. Therefore, a larger spin orbit torque can be generated.

The wiring SOTL and the magnetoresistance effect element MTJ can be formed at the same time by ion beam etching (IBE). As a result, the wiring SOTL becomes a rectangular shape having a long side and a short side when viewed in the Z direction. When viewed in the Z direction, the magnetoresistance effect element MTJ has a rectangular shape having side parallel to the short side of the wiring SOTL and having a length equal to the short side of the wiring SOTL, and a side shorter than the long side of the wiring SOTL and overlapping the long side of the wiring SOTL. When viewed in the Z direction, the non-magnetic layer 24c has a rectangular shape. The ferromagnetic layer 24b includes a portion having a rectangular shape when viewed in the Z direction and a projection portion MP which is located between the portion and the non-magnetic layer 24c and has a rectangular shape when viewed in the Z direction. Therefore, the ferromagnetic layer 24b can generate the leakage magnetic field SF directly below the magnetoresistance effect element MTJ. The leakage magnetic field SF acts on the ferromagnetic layer 27a in a direction of strengthening the bias magnetic field AFIE. Therefore, the load of a write operation can be reduced.

The side surface PXZ parallel to the XZ plane of the projecting portion BP of the ferromagnetic layer 24b is formed flush with the side surface parallel to the XZ plane of the ferromagnetic layer 27a. As a result, the influence of the leakage magnetic field SF on the ferromagnetic layer 27a can be increased. Therefore, the load of a write operation can be reduced.

When the wiring SOTL and the magnetoresistance effect element MTJ are formed by ion beam etching, the portion of the wiring SOTL that does not overlap with the magnetoresistance effect element MTJ when viewed in the Z direction is damaged by the etching gas. As a result, a part of ferromagnetic layer 24b and a part of the non-magnetic layer 24c are deactivated or altered and become the non-magnetic layers 24d-1 and 24d-2. Each of the non-magnetic layers 24d-1 and 24d-2 is in contact with the ferromagnetic layer 24b and the non-magnetic layer 24c. The non-magnetic layers 24d-1 and 24d-2 are provided apart from each other with the non-magnetic layer 24c interposed therebetween. The non-magnetic layers 24d-1 and 24d-2 include elements in the ferromagnetic layer 24b and elements in the non-magnetic layer 24c. As described above, the non-magnetic layer 24d loses the characteristics of the ferromagnetic layer 24b and the non-magnetic layer 24c. However, the non-magnetic layer 24d maintains the function as a conductive film for passing a write current through the non-magnetic layer 24c. Therefore, the non-magnetic layer 24d can contribute to the generation of a spin orbit torque.

2. Modification Example

The present disclosure is not limited to the above example embodiment, and various modifications can be adopted.

In the first embodiment, two-terminal type switching elements are used for the switching elements SEL1 and SEL2, but the present disclosure is not limited thereto. For example, three-terminal type switching elements may be used as the switching elements SEL1 and SEL2.

2.1 Circuit Configuration of Memory Cell Array

Figure 18:
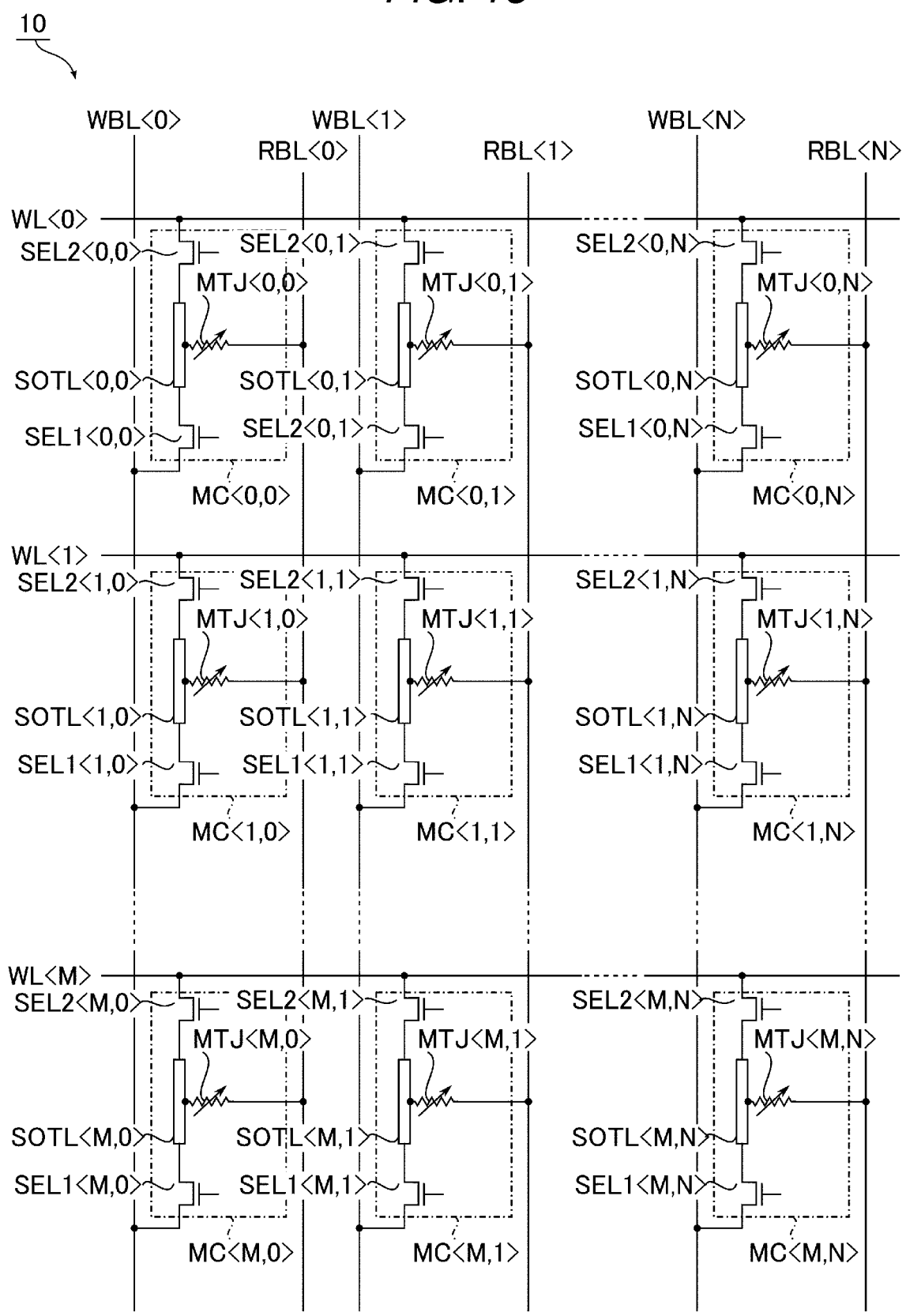
FIG. 18 is a circuit view of a memory cell array according to a modification example.

FIG. 18 is a circuit view illustrating an example of a circuit configuration of a memory cell array according to a modification example. FIG. 18 corresponds generally to FIG. 2.

The switching element SEL1<i,j>is coupled between the second portion of the wiring SOTL<i,j>and the write bit line WBL<j>. The magnetoresistance effect element MTJ<i,j>is coupled between the third portion of the wiring SOTL<i, j>and the read bit line RBL<j>. The switching element SEL2<i,j>is coupled between the first portion of the wiring SOTL<i,j>and the word line WL<i>.

The switching elements SEL1 and SEL2 are three-terminal type switching elements in this modification rather than two-terminal type of the first embodiment. The switching elements SEL1 and SEL2 may be, for example, surrounding gate transistors (SGT). The switching elements SEL1 and SEL2 can be independently controlled by different voltages being applied to the respective gate terminals thereof.

2.2 Planar Layout of Memory Cell Array

Figure 19:
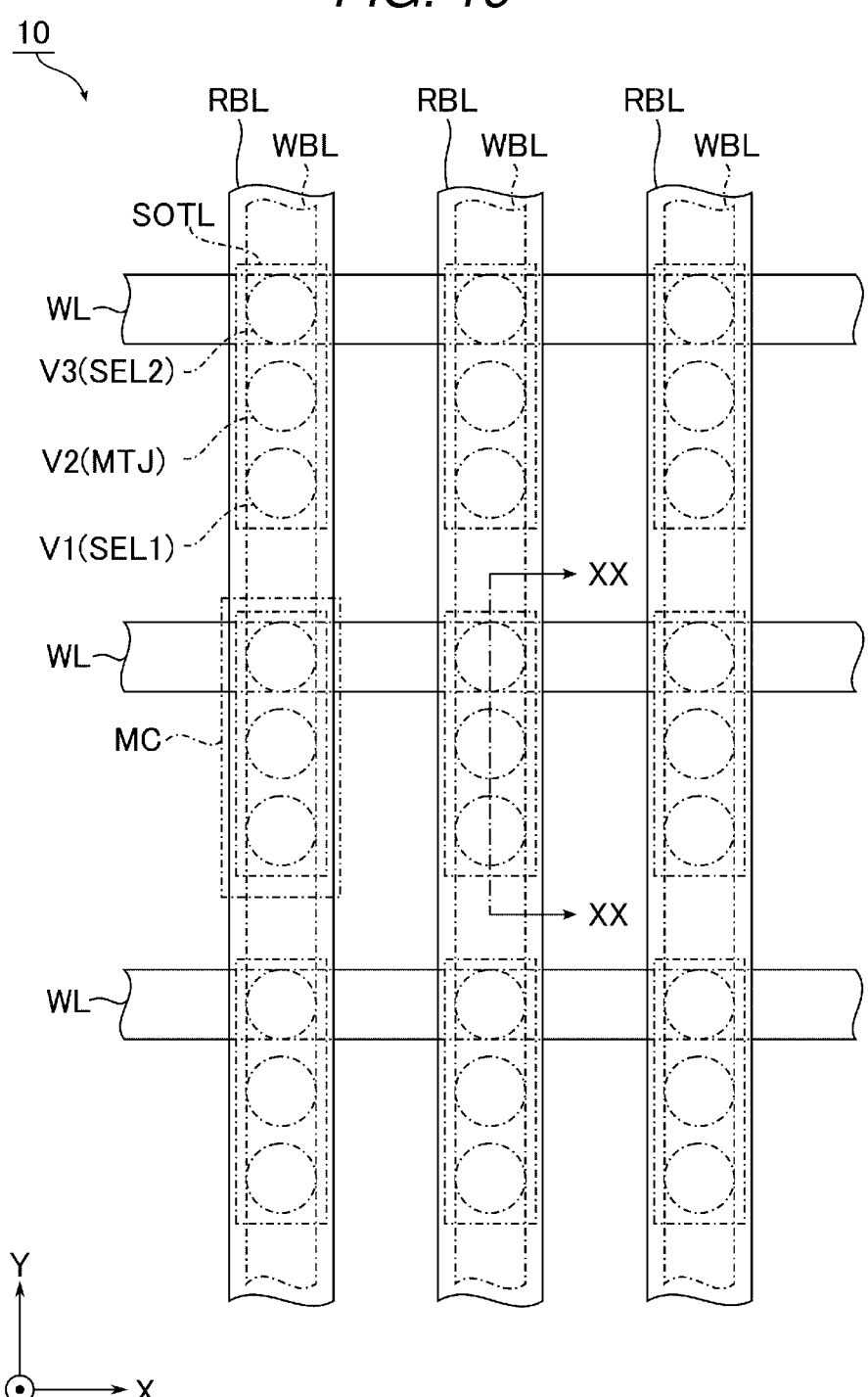
FIG. 19 is a plan view of a memory cell array according to a modification example.

FIG. 19 is a plan view illustrating an example of the planar layout of the memory cell array according to the modification example. FIG. 19 corresponds generally to FIG. 3. In FIG. 19, for convenience of description, the wiring coupled to gate terminals of the switching elements SEL1 and SEL2 is omitted.

In the memory cell array 10, each of the plurality of vertical structures V1 includes a switching element SEL1. Each of the plurality of vertical structures V2 includes a magnetoresistance effect element MTJ. Each of the plurality of vertical structures V3 includes a switching element SEL2.

A group (set) of one wiring SOTL, one vertical structure V1 coupled to the one wiring SOTL, one vertical structure V2, and one vertical structure V3 functions as a memory cell MC.

2.3 Cross-Sectional Structure of Memory Cell Array

Figure 20:
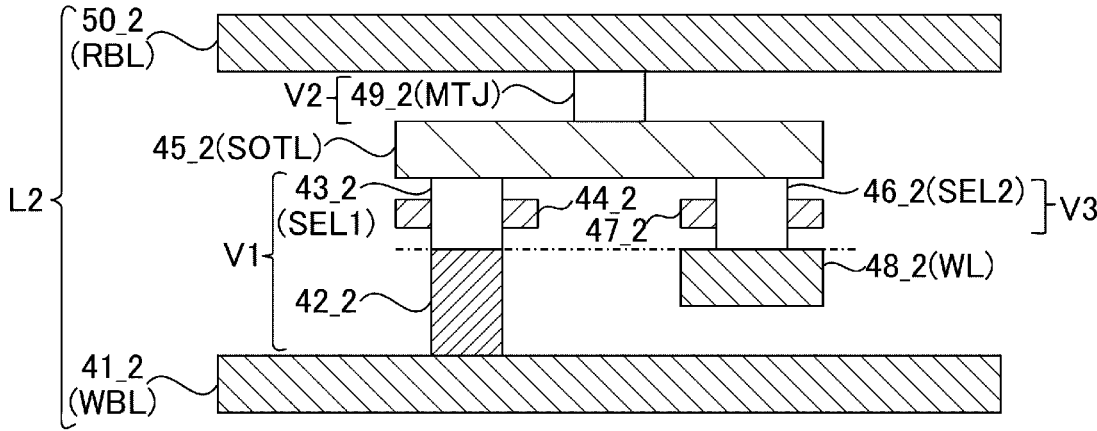
FIG. 20 is a cross-sectional view of a memory cell array according to a modification example.
Figure 20:
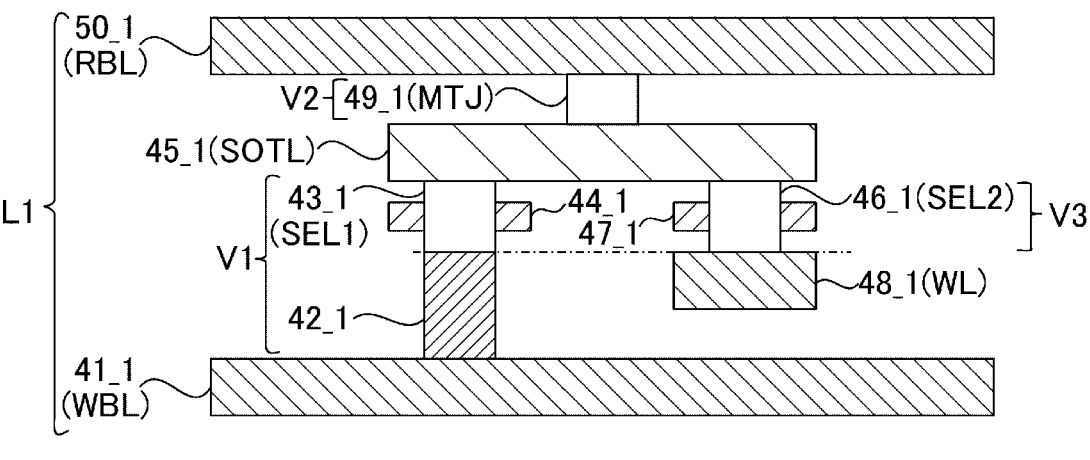
Figure 20:
Figure 20:
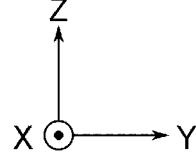

FIG. 20 is a cross-sectional view taken along the line XX-XX of FIG. 19, illustrating an example of the cross-sectional structure of the memory cell array according to the modification. FIG. 20 corresponds generally to FIG. 4 in the embodiment.

The structure L1 includes conductor layers 41_1, 42_1, 44_1, 45_1, 47_1, 48_1, and 50_1, and element layers 43_1, 46_1, and 49_1. The structure L2 includes conductor layers 41_2, 42_2, 44_2, 45_2, 47_2, 48_2, and 50_2, as well as element layers 43_2, 46_2, and 49_2.

First, the structure L1 will be described.

The conductor layer 41_1 is provided above the semiconductor substrate 20. The conductor layer 41_1 is used as a write bit line WBL. The conductor layer 41_1 extends in the Y direction.

The conductor layer 42_1 is provided on the upper surface of the conductor layer 41_1. The conductor layer 42_1 is used as a contact.

The element layer 43_1 is provided on the upper surface of the conductor layer 42_1. The element layer 43_1 is used as a switching element SEL1. The conductor layer 42_1 and the element layer 43_1 constitute the vertical structure V1.

The conductor layer 44_1 is provided around the element layer 43_1. The conductor layer 44_1 is used as a gate electrode of the switching element SEL1.

The conductor layer 45_1 is provided on the upper surface of the element layer 43_1. The conductor layer 45_1 is used as a wiring SOTL. The conductor layer 45_1 extends in the Y direction.

The element layer 46_1 is provided on the lower surface of the conductor layer 45_1, which is different from the portion where the element layer 43_1 is provided. The element layer 46_1 is used as a switching element SEL2. The element layer 46_1 constitutes the vertical structure V3.

The conductor layer 47_1 is provided around the element layer 46_1. The conductor layer 47_1 is used as a gate electrode of the switching element SEL2.

The element layers 43_1 and 46_1 are formed by the same process. In this case, the element layers 43_1 and 46_1 are provided at the same height. That is, the lower surface of the element layer 43_1 is located in the same XY plane as the lower surface of the element layer 46_1.

The conductor layer 48_1 is provided on the lower surface of the element layer 46_1. The conductor layer 48_1 is used as a word line WL. The conductor layer 48_1 extends in the X direction.

The element layer 49_1 is provided on the upper surface of the conductor layer 45_1 between the portion where the element layer 43_1 is provided and the portion where the element layer 46_1 is provided. The element layer 49_1 is used as a magnetoresistance effect element MTJ.

The conductor layer 50_1 is provided on the upper surface of the element layer 49_1. The conductor layer 50_1 is used as a read bit line RBL. The conductor layer 50_1 extends in the Y direction.

With the above configuration, a conductor layer 45_1 and the vertical structures V1, V2, and V3 function as one memory cell MC having three terminals coupled to the conductor layers 41_1, 48_1, and 50_1, respectively.

The structure L2 has the same structure as the structure L1. That is, the conductor layers 41_2, 42_2, 44_2, 45_2, 47_2, 48_2, and 50_2, and the element layers 43_2, 46_2, and 49_2 have the same structures and functions as the conductor layers 41_1, 42_1, 44_1, 45_1, 47_1, 48_1, and 50_1, and the element layers 43_1, 46_1, and 49_1, respectively. As a result, a conductor layer 45_2 and the vertical structures V1, V2, and V3 function one memory cell MC having three terminals coupled to the conductor layers 41_2, 48_2, and 50_2, respectively.

2.4 Effect according to Modification Example

According to the modification example, the memory cell MC includes the three-terminal type switching elements SEL1 and SEL2. The switching element SEL2 is provided between the wiring SOTL and the word line WL. As a result, the switching elements SEL1 and SEL2 can be provided at the same height. Therefore, the switching elements SEL1 and SEL2 can be formed in the same process. Therefore, it is possible to minimize an increase in the manufacturing load of the memory cell array 10.

3. Others

In the memory cell array 10 described in the above-described embodiment and the modification example, a case where the two structures L1 and L2 are stacked on the semiconductor substrate 20 is described, but the present disclosure is not limited thereto. For example, three or more structures having similar structures may be stacked on the semiconductor substrate 20. Furthermore, just a single structure may be stacked on the semiconductor substrate 20 in some examples.

In some examples, the switching elements SEL1 may be of a three-terminal type and the switching elements SEL may be of a two-terminal type.

In the above-described modification example, the three-terminal type switching elements SEL1 and SEL2 are provided at the same height, but the present disclosure is not limited thereto. For example, the two-terminal type switching elements SEL1 and SEL2 may be provided at the same height between the wiring SOTL and the write bit line WBL, and between the wiring SOTL and the word line WL, respectively.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A magnetic memory device, comprising:
a memory cell of a three-terminal type, the memory cell having a first terminal connected to a first conductor layer, a second terminal connected to a second conductor layer, and a third terminal connected to a third conductor layer, wherein
the memory cell includes:
a fourth conductor layer having a first portion connected to the first conductor layer, a second portion connected to the second conductor layer, and a third portion connected to the third conductor layer, the third portion being between the first portion and the second portion,
a magnetoresistance effect element coupled between the third conductor layer and the fourth conductor layer, and
the fourth conductor layer includes:
a first antiferromagnetic layer,
a first ferromagnetic layer between the first antiferromagnetic layer and the magnetoresistance effect element and having a protruding portion extending upward towards the magnetoresistance effect element,
a first non-magnetic layer between the first ferromagnetic layer and the magnetoresistance effect element, the first non-magnetic layer directly contacting an upper surface of the protruding portion, and
a second non-magnetic layer having a composition different from the first non-magnetic layer, the second non-magnetic layer directly contacting an upper surface of a portion of the first ferromagnetic layer that is outside the protruding portion, the second nonmagnetic layer directly contacting a sidewall surface of the protruding portion and a sidewall surface of the first non-magnetic layer, wherein
the first non-magnetic layer is outside the magnetoresistance effect element and comprises a first element selected from ruthenium, iridium, rhodium, and osmium, and
an uppermost surface of the first non-magnetic layer is further from the first antiferromagnetic layer than is an uppermost surface of the second non-magnetic layer but the upper surface of the protruding portion of the first ferromagnetic layer is closer to the first antiferromagnetic layer than is the uppermost surface of the second non-magnetic layer.

2. The magnetic memory device according to claim 1, wherein the first non-magnetic layer has a film thickness of three nanometers or less.

3. The magnetic memory device according to claim 1, wherein the first ferromagnetic layer comprises a second element selected from iron, cobalt, nickel, and gadolinium.

4. The magnetic memory device according to claim 3, wherein the first ferromagnetic layer further comprises a third element selected from neodymium, samarium, europium, terbium, dysprosium, and holmium.

5. The magnetic memory device according to claim 4, wherein the first ferromagnetic layer includes an amorphous alloy comprising the second element and the third element.

6. The magnetic memory device according to claim 4, wherein the first ferromagnetic layer comprises a layer including the second element and a layer including the third element.

7. The magnetic memory device according to claim 1, wherein the magnetoresistance effect element has:
a first resistance value with respect to a first current flowing from the first portion of the fourth conductor layer to the second portion of the fourth conductor layer, and
a second resistance value with respect to a second current flowing from the second portion of the fourth conductor layer to the first portion of the fourth conductor layer, the second resistance value being different from the first resistance value.

8. The magnetic memory device according to claim 1, wherein
the first ferromagnetic layer, the first non-magnetic layer, and the magnetoresistance effect element are stacked on each other in a first direction,
the fourth conductor layer has a first rectangular shape with a long side and a short side, and
the magnetoresistance effect element has a second rectangular shape having a first side with a length equal to the short side of the fourth conductor layer that is parallel to the short side of the fourth conductor layer and a second side with a length less than the long side of the fourth conductor layer but overlapping with the long side of the fourth conductor layer when viewed in the first direction.

9. The magnetic memory device according to claim 8, wherein
the first non-magnetic layer has a shape equal to the second rectangular shape when viewed in the first direction, and
the first ferromagnetic layer has a fourth portion having a shape equal to the first rectangular shape and a fifth portion having a shape equal to the second rectangular shape when viewed in the first direction, the fifth portion being between the fourth portion and the first non-magnetic layer.

10. The magnetic memory device according to claim 1, wherein
the memory cell further includes:
a first switching element coupled between the second conductor layer and the fourth conductor layer; and
a second switching element coupled between the first conductor layer and the third conductor layer, and
the second switching element is a two-terminal type switching element that is coupled between the third conductor layer and the magnetoresistance effect element.

11. The magnetic memory device according to claim 1, wherein the memory cell further includes:

a first switching element coupled between the second conductor layer and the fourth conductor layer; and a second switching element coupled between the first conductor layer and the third conductor layer, and the second switching element is coupled between the first conductor layer and the fourth conductor layer.

12. The magnetic memory device according to claim 1, wherein the memory cell further includes:

a first switching element coupled between the second conductor layer and the fourth conductor layer; and a second switching element coupled between the first conductor layer and the third conductor layer, and the first switching element and the second switching element are both two-terminal type switching elements.

13. The magnetic memory device according to claim 1, wherein the memory cell further includes:

a first switching element coupled between the second conductor layer and the fourth conductor layer; and a second switching element coupled between the first conductor layer and the third conductor layer, and the first switching element and the second switching element are both three-terminal type switching elements.

14. A magnetic memory device, comprising:

a memory cell of a three-terminal type, the memory cell having a first terminal connected to a first conductor layer, a second terminal connected to a second conductor layer, and a third terminal connected to a third conductor layer, wherein the memory cell includes:

a fourth conductor layer having a first portion connected to the first conductor layer, a second portion connected to the second conductor layer, and a third portion connected to the third conductor layer, the third portion being between the first portion and the second portion, a magnetoresistance effect element coupled between the third conductor layer and the fourth conductor layer, a first switching element coupled between the second conductor layer and the fourth conductor layer, and a second switching element coupled between the first conductor layer and the third conductor layer, the fourth conductor layer includes:

a first antiferromagnetic layer that electrically contacts the first and second switching elements, a first ferromagnetic layer that is electrically conductive and directly contacting the first antiferromagnetic layer, the first ferromagnetic layer being between the first antiferromagnetic layer and the magnetoresistance effect element and having a protruding portion extending upward towards the magnetoresistance effect element, the first ferromagnetic layer comprising a first element selected from neodymium, samarium, europium, terbium, dysprosium, and holmium, a first non-magnetic layer that is electrically conductive and directly contacting an upper surface of the protruding portion of the first ferromagnetic layer and being between the first ferromagnetic layer and the magnetoresistance effect element, and a second non-magnetic layer that is electrically conductive and having a composition different from the first non-magnetic layer, the second non-magnetic layer directly contacting an upper surface of a portion of the first ferromagnetic layer that is outside the protruding portion, the second nonmagnetic layer directly contacting a sidewall surface of the protruding portion and a sidewall surface of the first non-magnetic layer, wherein an uppermost surface of the first non-magnetic layer is further from the first antiferromagnetic layer than is an uppermost surface of the second non-magnetic layer but the upper surface of the protruding portion of the first ferromagnetic layer is closer to the first antiferromagnetic layer than is the uppermost surface of the second non-magnetic layer.

15. The magnetic memory device according to claim 14, wherein the first non-magnetic layer has the same planar shape as the protruding portion when viewed from a direction orthogonal to the fourth conductor layer.

16. The magnetic memory device according to claim 14, wherein the first non-magnetic layer has a film thickness of three nanometers or less, and the first non-magnetic layer comprises:

a second element selected from ruthenium, iridium, rhodium, and osmium.

* * * * *